(12) United States Patent
Basol et al.

(10) Patent No.: US 7,425,250 B2
(45) Date of Patent: Sep. 16, 2008

(54) ELECTROCHEMICAL MECHANICAL PROCESSING APPARATUS

(75) Inventors: Bulent M. Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 314 days.

(21) Appl. No.: 10/830,894

(22) Filed: Apr. 23, 2004

(65) Prior Publication Data

US 2005/0016868 A1  Jan. 27, 2005

Related U.S. Application Data

(60) Continuation-in-part of application No. 10/292,750, filed on Nov. 12, 2002, now Pat. No. 7,341,649, and a continuation-in-part of application No. 10/288,558, filed on Nov. 4, 2002, now Pat. No. 7,097,755, and a continuation-in-part of application No. 10/117,991

(Continued)

(30) Foreign Application Priority Data

Nov. 16, 2001  (JP)  ............................. 2001-390639

(51) Int. Cl.
  *C25F 7/00*  (2006.01)
  *C25F 3/30*  (2006.01)
  *C25D 17/00*  (2006.01)
  *B23H 3/00*  (2006.01)

(52) U.S. Cl. .................. 204/198; 204/202; 204/224 R; 204/224 M; 204/228.8; 204/275.1; 205/123; 205/640; 205/651; 205/662; 205/668; 205/686

(58) Field of Classification Search ......... 204/198–199, 204/206–209, 212, 224 R, 224 M, 242, 202, 204/228.8, 275.1; 205/640, 651, 654, 662–663, 205/123, 668, 686
See application file for complete search history.

(56) References Cited

U.S. PATENT DOCUMENTS 669,923 A  3/1901  Grauert (Continued)

FOREIGN PATENT DOCUMENTS

DE  2008664  9/1971

(Continued)

*Primary Examiner*—Roy King
*Assistant Examiner*—Lois L. Zheng
(74) *Attorney, Agent, or Firm*—Knobbe, Martens, Olson & Bear, LLP

(57) ABSTRACT

A system for electrochemical mechanical polishing of a conductive surface of a wafer is provided. The system includes a wafer holder to hold the wafer and a belt pad disposed proximate to the wafer to polish the conductive surface. Application of a potential difference between conductive surface and an electrode and establishing relative motion between the belt pad and the conductive surface result in material removal from the conductive surface. Electrical contact to the surface is provided through either contacts embedded in the belt pad or contacts placed adjacent the belt pad.

33 Claims, 14 Drawing Sheets

Related U.S. Application Data

(60) filed on Apr. 5, 2002, now Pat. No. 6,821,409, said application No. 10/292,750 is a continuation of application No. 09/607,567, filed on Jun. 29, 2000, now Pat. No. 6,676,822, which is a division of application No. 09/201,929, filed on Dec. 1, 1998, now Pat. No. 6,176,992, application No. 10/830,894, which is a continuation-in-part of application No. 10/302,213, filed on Nov. 22, 2002, which is a continuation of application No. 09/685,934, filed on Oct. 11, 2000, now Pat. No. 6,497,800, application No. 10/830,894, which is a continuation-in-part of application No. 10/460,032, filed on Jun. 11, 2003, now Pat. No. 6,942,780, which is a continuation of application No. 09/760,757, filed on Jan. 17, 2001, now Pat. No. 6,610,190, application No. 10/830,894, which is a continuation-in-part of application No. 10/252,149, filed on Sep. 20, 2002, now Pat. No. 6,604,988, which is a continuation of application No. 09/880,730, filed on Jun. 12, 2001, now Pat. No. 6,464,571, which is a continuation-in-part of application No. 09/576,064, filed on May 22, 2000, now Pat. No. 6,207,572, which is a continuation of application No. 09/201,928, filed on Dec. 1, 1998, now Pat. No. 6,103,628.

(56) References Cited

U.S. PATENT DOCUMENTS

| | | |
|---|---|---|
| 2,540,602 A | 2/1951 | Thomas et al. |
| 2,708,181 A | 5/1955 | Holmes et al. |
| 2,965,556 A | 12/1960 | Laurits |
| 3,328,273 A | 6/1967 | Creutz et al. |
| 3,448,023 A | 6/1969 | Bell |
| 3,559,346 A | 2/1971 | Paola |
| 3,637,468 A | 1/1972 | Icxi et al. |
| 3,779,887 A | 12/1973 | Gildone |
| 3,888,050 A | 6/1975 | Elm |
| 3,959,089 A | 5/1976 | Watts |
| 3,990,959 A | 11/1976 | Payne et al. |
| 4,339,319 A | 7/1982 | Aigo |
| 4,391,684 A | 7/1983 | Goddard |
| 4,412,400 A | 11/1983 | Hammond |
| 4,430,173 A | 2/1984 | Boudot et al. |
| 4,431,501 A | 2/1984 | Leppanen |
| 4,610,772 A | 9/1986 | Palnik |
| 4,713,149 A | 12/1987 | Hoshino |
| 4,772,361 A | 9/1988 | Dorsett et al. |
| 4,802,309 A | 2/1989 | Heynacher |
| 4,944,119 A | 7/1990 | Gill et al. |
| 4,948,474 A | 8/1990 | Miljkovic |
| 4,954,142 A | 9/1990 | Carr et al. |
| 4,975,159 A | 12/1990 | Dahms |
| 5,024,735 A | 6/1991 | Kadija |
| 5,084,071 A | 1/1992 | Nenadic et al. |
| 5,095,661 A | 3/1992 | Gill et al. |
| 5,162,047 A | 11/1992 | Wada et al. |
| 5,171,412 A | 12/1992 | Talieh et al. |
| 5,245,796 A | 9/1993 | Miller et al. |
| 5,256,565 A | 10/1993 | Bernhardt et al. |
| 5,329,732 A | 7/1994 | Karlsrud et al. |
| 5,335,453 A | 8/1994 | Baldy et al. |
| 5,354,490 A | 10/1994 | Yu et al. |
| 5,377,452 A | 1/1995 | Yamaguchi |
| 5,377,453 A | 1/1995 | Perneczky |
| 5,429,733 A | 7/1995 | Ishida |
| 5,472,592 A | 12/1995 | Lowery |
| 5,473,433 A | 12/1995 | Miller |
| 5,476,414 A | 12/1995 | Hirose et al. |
| 5,489,235 A | 2/1996 | Gagliardi et al. |
| 5,498,199 A | 3/1996 | Karlsrud et al. |
| 5,516,412 A | 5/1996 | Andricacos et al. |
| 5,518,542 A | 5/1996 | Matsukawa et al. |
| 5,558,568 A | 9/1996 | Talieh et al. |
| 5,565,034 A | 10/1996 | Nanbu et al. |
| 5,593,344 A | 1/1997 | Weldon et al. |
| 5,650,039 A | 7/1997 | Talieh |
| 5,679,212 A | 10/1997 | Kato et al. |
| 5,681,215 A | 10/1997 | Sherwood et al. |
| 5,686,143 A | 11/1997 | Matsukawa et al. |
| 5,692,947 A | 12/1997 | Talieh et al. |
| 5,700,366 A | 12/1997 | Steblianko et al. |
| 5,707,409 A | 1/1998 | Martin et al. |
| 5,755,859 A | 5/1998 | Brusic et al. |
| 5,759,918 A | 6/1998 | Hoshizaki et al. |
| 5,762,544 A | 6/1998 | Zuniga et al. |
| 5,762,751 A | 6/1998 | Bleck et al. |
| 5,770,095 A | 6/1998 | Sasaki et al. |
| 5,770,521 A | 6/1998 | Pollock |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,810,964 A | 9/1998 | Shiraishi |
| 5,833,820 A | 11/1998 | Dublin |
| 5,840,629 A | 11/1998 | Carpio |
| 5,851,136 A | 12/1998 | Lee |
| 5,858,813 A | 1/1999 | Scherber et al. |
| 5,863,412 A | 1/1999 | Ichinose et al. |
| 5,882,498 A | 3/1999 | Dubin et al. |
| 5,884,990 A | 3/1999 | Burghartz et al. |
| 5,893,755 A | 4/1999 | Nakayoshi |
| 5,897,375 A | 4/1999 | Watts et al. |
| 5,899,798 A | 5/1999 | Trojan et al. |
| 5,899,801 A | 5/1999 | Tolles et al. |
| 5,908,530 A | 6/1999 | Hoshizaki et al. |
| 5,911,619 A | 6/1999 | Uzoh et al. |
| 5,913,716 A | 6/1999 | Mucci et al. |
| 5,922,091 A | 7/1999 | Tsai et al. |
| 5,930,669 A | 7/1999 | Uzoh |
| 5,933,753 A | 8/1999 | Simon et al. |
| 5,951,377 A | 9/1999 | Vaughn et al. |
| 5,954,997 A | 9/1999 | Kaufman et al. |
| 5,961,372 A | 10/1999 | Shendon |
| 5,968,333 A | 10/1999 | Nogami et al. |
| 5,975,988 A | 11/1999 | Christianson |
| 5,976,331 A | 11/1999 | Chang et al. |
| 5,985,123 A | 11/1999 | Koon |
| 5,993,302 A | 11/1999 | Chen et al. |
| 6,001,235 A | 12/1999 | Arken et al. |
| 6,004,880 A | 12/1999 | Liu et al. |
| 6,009,890 A | 1/2000 | Kaneko et al. |
| 6,017,831 A | 1/2000 | Beardsley et al. |
| 6,024,630 A | 2/2000 | Shendon et al. |
| 6,027,631 A | 2/2000 | Broadbent |
| 6,045,716 A | 4/2000 | Walsh et al. |
| 6,063,506 A | 5/2000 | Andricacos et al. |
| 6,066,030 A | 5/2000 | Uzoh |
| 6,068,542 A | 5/2000 | Hosokai |
| 6,071,388 A | 6/2000 | Uzoh |
| 6,074,544 A | 6/2000 | Reid et al. |
| 6,086,454 A | 7/2000 | Watanabe et al. |
| 6,103,085 A | 8/2000 | Woo et al. |
| 6,103,628 A | 8/2000 | Talieh |
| 6,110,025 A | 8/2000 | Williams et al. |
| 6,113,479 A | 9/2000 | Sinclair et al. |
| 6,129,540 A | 10/2000 | Hoopman et al. |
| 6,132,587 A | 10/2000 | Jorne et al. |
| 6,135,859 A | 10/2000 | Tietz |
| 6,136,163 A | 10/2000 | Cheung et al. |
| 6,136,715 A | 10/2000 | Shendon |
| 6,143,155 A | 11/2000 | Adams et al. |
| 6,156,167 A | 12/2000 | Patton et al. |

| | | | | | | |
|---|---|---|---|---|---|---|
| 6,159,354 | A | 12/2000 | Contolini et al. | 6,468,139 B1 | 10/2002 | Talieh et al. |
| 6,162,344 | A | 12/2000 | Reid et al. | 6,475,070 B1 | 11/2002 | White |
| 6,176,992 | B1 | 1/2001 | Talieh | 6,482,307 B2 * | 11/2002 | Ashjaee et al. ............... 205/103 |
| 6,179,690 | B1 | 1/2001 | Talieh | 6,500,056 B1 | 12/2002 | Krusell et al. |
| 6,179,709 | B1 | 1/2001 | Redeker et al. | 6,537,144 B1 | 3/2003 | Tsai et al. |
| 6,180,020 | B1 | 1/2001 | Moriyama et al. | 6,589,105 B2 * | 7/2003 | Young et al. ................. 451/296 |
| 6,187,152 | B1 | 2/2001 | Ting et al. | 2002/0111121 A1 | 8/2002 | Sun et al. |
| 6,207,572 | B1 | 3/2001 | Talieh | 2002/0119286 A1 | 8/2002 | Chen et al. |
| 6,210,554 | B1 | 4/2001 | Kosaki et al. | 2002/0123298 A1 | 9/2002 | Krusell et al. |
| 6,228,231 | B1 | 5/2001 | Uzoh | 2002/0134748 A1 * | 9/2002 | Basol et al. .................... 216/13 |
| 6,241,583 | B1 | 6/2001 | White | 2004/0007478 A1 * | 1/2004 | Basol et al. ................. 205/668 |
| 6,251,236 | B1 | 6/2001 | Stevens | | | |

FOREIGN PATENT DOCUMENTS

| | | |
|---|---|---|
| 6,261,426 B1 | 7/2001 | Uzoh et al. |
| 6,267,642 B1 | 7/2001 | Vogtmann et al. |
| 6,270,646 B1 | 8/2001 | Walton et al. |
| 6,302,767 B1 | 10/2001 | Tietz |
| 6,312,319 B1 | 11/2001 | Donohue et al. |
| 6,334,937 B1 | 1/2002 | Batz et al. |
| 6,354,926 B1 | 3/2002 | Walsh |
| 6,379,231 B1 | 4/2002 | Birang et al. |
| 6,405,740 B1 | 6/2002 | Vogtmann et al. |
| 6,413,873 B1 | 7/2002 | Li et al. |
| 6,419,559 B1 | 7/2002 | Gurusamy et al. |
| 6,428,394 B1 | 8/2002 | Mooring et al. |
| 6,439,978 B1 | 8/2002 | Jones et al. |
| 6,443,824 B2 | 9/2002 | Shendon et al. |
| 6,464,855 B1 * | 10/2002 | Chadda et al. ............... 205/662 |

| | | |
|---|---|---|
| DE | 31 13 204 A | 10/1982 |
| DE | 4324330 | 3/1994 |
| EP | 0 517 594 A | 12/1992 |
| EP | 1 037 263 A2 | 9/2000 |
| WO | WO 97/20660 A | 6/1997 |
| WO | WO 98/27585 | 6/1998 |
| WO | WO 99/22908 | 5/1999 |
| WO | WO 00/26443 | 5/2000 |
| WO | WO 02/02272 | 1/2002 |
| WO | WO 02/29859 | 4/2002 |
| WO | WO 02/057514 | 7/2002 |
| WO | WO 03/028048 A2 | 4/2003 |

* cited by examiner

ELECTROCHEMICAL MECHANICAL PROCESSING APPARATUS

RELATED APPLICATIONS

This application is a continuation in part of U.S. patent application Ser. No. 10/288,558 filed on Nov. 4, 2002 now U.S. Pat. No. 7,097,755 and this application is also a continuation in part of U.S. patent application Ser. No. 10/117,991, filed on Apr. 5, 2002 now U.S. Pat. No. 6,821,409 and this application is also a continuation-in-part of U.S. patent application Ser. No. 10/292,750, filed on Nov. 12, 2002 now U.S. Pat. No. 7,341,649, which is a continuation of U.S. patent application Ser. No. 09/607,567, filed Jun. 29, 2000 now U.S. Pat. No. 6,676,822, which is a divisional of U.S. Ser. No. 09/201,929 filed Dec. 1, 1998, now U.S. Pat. No. 6,176,992, this application is also a continuation in part of U.S. patent application Ser. No. 10/302,213, filed Nov. 22, 2002, which is a continuation of U.S. application Ser. No. 09/685,934, filed Oct. 11, 2000, now U.S. Pat. No. 6,497,800, this application is also a continuation in part of U.S. patent application Ser. No. 10/460,032, filed Jun. 11, 2003 now U.S. Pat. No. 6,942,780, which is a continuation of U.S. application Ser. No. 09/760,757, filed Jan. 17, 2001, now U.S. Pat. No. 6,610,190, this application is also a continuation in part of U.S. patent application Ser. No. 10/252,149, filed Sep. 20, 2002, now U.S. Pat. No. 6,604,988 which is a continuation of U.S. patent application Ser. No. 09/880,730, filed Jun. 12, 2001, now U.S. Pat. No. 6,464,571, which is a continuation in part of U.S. patent application Ser. No. 09/576,064, filed May 22, 2000, now U.S. Pat. No. 6,207,572, which is a continuation of U.S. patent application Ser. No. 09/201,928, filed Dec. 1, 1998, now U.S. Pat. No. 6,103,628, all incorporated herein by reference.

FIELD

The present invention generally relates to semiconductor integrated circuit technology and, more particularly, to a device for electrotreating or electrochemically processing a workpiece.

BACKGROUND

Conventional semiconductor devices such as integrated circuits (IC) generally comprise a semiconductor substrate, usually a silicon substrate, and a plurality of conductive material layers separated by insulating material layers. Conductive material layers, or interconnects, form the wiring network of the integrated circuit. Each level of conductor in the wiring network is isolated from the neighboring level of conductors by the insulating layers, also known as interlayer dielectrics. One dielectric material that is commonly used in silicon integrated circuits is silicon dioxide, although there is now a trend to replace at least some of the standard dense silicon dioxide material in IC structures with low-k dielectric materials such as organic, inorganic, spin-on and CVD candidates. Conventionally, IC interconnects are formed by filling a conductor such as copper in features or cavities etched into the dielectric interlayers by a metallization process. Copper is becoming the preferred conductor for interconnect applications because of its low electrical resistance and good electromigration property. The preferred method of copper metallization process is electroplating. In an integrated circuit, multiple levels of interconnect networks laterally extend with respect to the substrate surface. Interconnects formed in sequential layers can be electrically connected using features such as vias or contacts. In a typical interconnect fabrication process; first an insulating layer is formed on the semiconductor substrate, patterning and etching processes are then performed to form features or cavities such as trenches, vias, and pads etc., in the insulating layer. Then, copper is electroplated to fill all the features. In such electroplating processes, the wafer is placed on a wafer carrier and a cathodic (−) voltage with respect to an electrode is applied to the wafer surface while the electrolyte solution wets both the wafer surface and the electrode.

Once the plating is over, a material removal step such as a chemical mechanical polishing (CMP) process step is conducted to remove the excess copper layer, which is also called copper overburden, from the top surfaces (also called the field region) of the workpiece leaving copper only in the features. An additional material removal step is then employed to remove the other conductive layers such as the barrier/glue layers that are on the field region. Fabrication in this manner results in copper deposits within features that are physically as well as electrically isolated from each other. Other conventional etching techniques can also be used, and conventional approaches exist that can remove both copper and the barrier/glue layers from the field region in one step. A particular type of CMP apparatus that works effectively is described in U.S. Pat. No. 6,103,628 entitled Reverse Linear Polisher with Loadable housing.

The adverse effects of conventional material removal technologies may be minimized or overcome by employing a planar deposition approach that has the ability to provide thin layers of planar conductive material on the workpiece surface, as well as planar removal processes. These planar deposition and removal processes also have application in thru-resist processes employed in IC packaging. In these applications plating is performed into holes opened in resist layers onto seed films exposed on the bottom of each hole or opening.

One technique is collectively referred to as Electrochemical Mechanical Processing (ECMPR), which term is used to include both Electrochemical Mechanical Deposition (ECMD) processes as well as Electro Chemical Mechanical Etching (ECME), and also called Electrochemical Mechanical Polishing. It should be noted that in general both ECMD and ECME processes are referred to as electrochemical mechanical processing (ECMPR) since both involve electrochemical processes and mechanical action.

In one aspect of an ECMPR process, a workpiece surface influencing device (WSID) such as a mask, pad or a sweeper is used during at least a portion of the electrotreatment process when there is physical contact or close proximity and relative motion between the workpiece surface and the WSID. Descriptions of various planar deposition and planar etching methods and apparatus can be found in the following patents and pending applications, all commonly owned by the assignee of the present invention: U.S. Pat. No. 6,176,992, entitled Method and Apparatus for Electrochemical Mechanical Deposition; U.S. application Ser. No. 09/740,701, filed on Dec. 18, 2001, now U.S. Pat. No. 6,534,116, entitled Plating Method and Apparatus that Creates a Differential Between Additive Disposed on a Top Surface and a Cavity Surface of a Workpiece Using an External Influence; and U.S. application Ser. No. 09/961,193, filed on September 20, now U.S. Pat. No. 6,921,551, entitled Plating Method and Apparatus for Controlling Deposition on Predetermined Portions of a Workpiece. These methods can deposit metals in and over cavity sections on a workpiece in a planar manner. They also have the capability of yielding novel structures with excess amount of metals over the features irrespective of their size, if desired.

In ECMD methods, the surface of the workpiece is wetted by the electrolyte and is rendered cathodic with respect to an electrode, which is also wetted by the electrolyte. This typically results in conductive material deposition within the features of the workpiece, and a thin layer on the top surface of the workpiece. During ECMD, the wafer surface is pushed against or in close proximity to the surface of the WSID or vice versa when relative motion between the surface of the workpiece and the WSID results in sweeping of the workpiece surface. Planar deposition is achieved due to this sweeping action as described in the above-cited patent applications.

In ECME methods, the surface of the workpiece is wetted by the electrolyte or etching solution, but the polarity of the applied voltage is reversed, thus rendering the workpiece surface more anodic compared to the electrode. If no voltage difference is applied, the etching is chemical etching and can be performed when there is physical contact or close proximity between the workpiece and the WSID. The chemical etching can be carried out using the process solution or an etching solution.

Very thin planar deposits can be obtained by first depositing a planar layer using an ECMD technique and then using an ECME technique on the planar film in the same electrolyte by reversing the applied voltage. Alternately the ECME step can be carried out in a separate machine and a different etching electrolyte. The thickness of the deposit may be reduced in a planar manner. In fact, an ECME technique may be continued until all the metal on the field regions is removed. It should be noted that a WSID may or may not be used during the electroetching or etching process since substantially planar etching can be achieved with or without the use of WSID.

FIG. 1A, is a schematic illustration of an exemplary conventional ECMPR system 100 used for processing wafers. In FIG. 1A, a WSID 102 having openings 104 in it, is disposed in close proximity of a workpiece or wafer 106 to be processed. The WSID 102 is supported by a support plate 108 having perforations 110 or openings in it. The wafer 106 is a silicon wafer to be plated with a conductive material, preferably copper or a copper alloy. The wafer 106 is retained by a wafer carrier 111 so as to position front surface 112 of the wafer against top surface 113 of the WSID 102. The openings 104 are designed to assure uniform deposition of copper from an electrolyte solution, depicted by arrows 114, onto the front surface 112, or uniform electroetching from the front surface 112. The perforations 110 may or may not exactly match the design of the openings 104. Generally, the openings 104 are designed for uniform deposition, and perforations 110 are such that the electrical field and electrolyte solution pass substantially unhindered to the WSID 102. Therefore, the area of perforations per unit area of the support plate 108 is equal to or larger than the area of the openings per unit area of the WSID 102. The top surface 113 of the WSID 102 facing the front surface 112 of the wafer is used as the sweeper and the WSID 102 itself establishes appropriate electrolyte flow and electric field flow to the front surface 112 for globally uniform deposition or etching. Such an ECMPR system 100 also includes an electrode 116, which is immersed in the electrolyte solution 114. The electrolyte 114 is in fluid communication with the electrode 116 and the front surface 112 of the wafer 106 through the openings 104 in the WSID 102.

The electrode 116 is typically a Cu piece for Cu deposition. It may also be an inert electrode made of, for example, Pt coated Ti. An exemplary copper electrolyte solution may be copper sulfate solution with additives such as accelerators, suppressors, leveler, chloride and such, which are commonly used in the industry. In planar deposition techniques such as ECMD, the leveler is not very necessary since leveling is automatically done by the process. Leveler may be added however, for optimization of other process results such as gap fill, etc. The top surface 113 of the WSID 102 sweeps the front surface 112 of the wafer 106 while an electrical potential is established between the electrode 116 and the front surface 112 of the wafer 106. For deposition of a planar film such as copper, the front surface 112 of the wafer 106 is made more cathodic (negative) compared to the electrode 116, which becomes the anode. For electroetching in the same ECMPR system, the wafer surface 112 is made more anodic than the electrode 116. For chemical etching or etching, no potential difference is applied between the wafer 106 and the electrode 116.

As shown in FIG. 1B, the structure of the WSID 102 may have a top layer 120, an intermediate layer 122, and a bottom layer 124. The top layer 120 may preferably be made of an abrasive material such as a the class of fixed-abrasive-films supplied by the 3M company, or any of the other so-called pad materials used in CMP applications, such as the polymeric IC-1000 material supplied by Rodel. The thickness of the top layer 120 may be typically in the range of 0.05-2 mm. The intermediate layer 122 is the mounting layer for the top layer 120 and the holes are defined in the intermediate layer 122 and the bottom layer 124. The intermediate layer 122 is typically made of a hard plastic material such as polycarbonate with a thickness range of 1-3 mm. The bottom layer 124 functions as a compression layer for the whole structure. The bottom layer is made of a polymeric foam material such as polyurethane or polypropylene. U.S. Pat. Nos. 6,413,403 and 6,413,388, which are assigned to the assignee of the present invention, disclose various examples of WSIDs. Further, U.S. patent application Ser. No. 09/960,236% filed on Sep. 20, 2001, now U.S. Pat. No. 7,201,829, entitled Mask Plate Design, discloses various WSID embodiments. Further, U.S. patent application Ser. No. 10/155,828, filed on May 23, 2002, now U.S. Pat. No. 7,238,092, entitled Low Force Electrochemical Mechanical Deposition Method and Apparatus, discloses a WSID structure having a flexible and abrasive top layer attached on a highly compressible layer. Both patents are assigned to the assignee of the present invention. The WSID is placed on a porous support plate which may be or may not be an integral part of the WSID. In this particular structure, electrolyte is flowed through the openings or the open pores of the compressible layer and the openings in the flexible layer.

To this end, however, while these techniques assist in obtaining planar metal deposits or novel metal structures on workpieces and wafers, there is still a need for further development of high-throughput approaches and devices that can yield deposits with better uniformity and high yield.

SUMMARY

The present invention provides a system for electrochemical mechanical polishing of a conductive surface of a wafer. The system includes a belt pad to polish the conductive surface while a relative motion is applied between the conductive surface and the belt pad and while a potential difference is maintained between the conductive surface and an electrode. Electrical contact to the surface of the wafer is provided through either contacts embedded in the belt pad or contacts placed adjacent the belt pad.

DETAILED DESCRIPTION

The preferred embodiments will now be described using the example of fabricating interconnects for integrated circuit applications. It should, however, be recognized that present invention can be used to operate on any workpiece with various electroplated materials such as Au, Ag, Ni, Pt, Pd, Fe, Sn, Cr, Pb, Zn, Co and their alloys with each other or other materials, for many different applications such as packaging, flat panel displays, magnetic heads and such. In the examples provided below, the example material that is electroplated will be described as copper, but it will be understood that other materials can instead be used.

Further, the preferred embodiment will be described in the context of depositing planar layers. Other novel structures, which may also require electroetching, chemical etching and other processes, as described in the above-mentioned ECMPR patents and applications, can also be obtained using this invention. In one embodiment, for example, a planar conductive layer is formed on a wafer surface by an ECMD process using a belt WSID structure of the present invention. Other structures may also be formed using low-force electrochemical mechanical etching (ECME) as disclosed in previous applications.

Figure 1A:
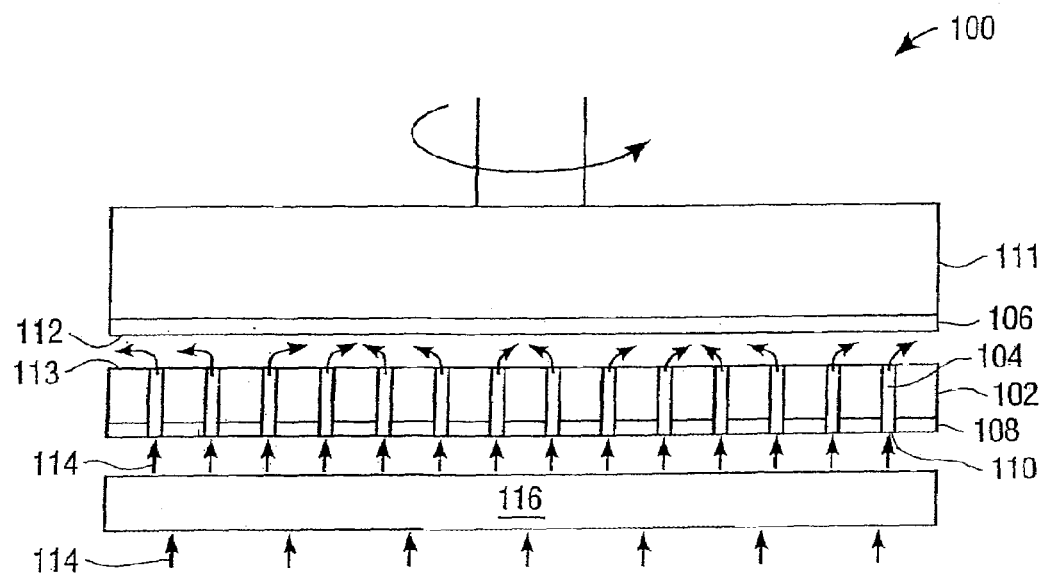
FIG. 1A is schematic illustration of a conventional ECMPR system.
Figure 1B:
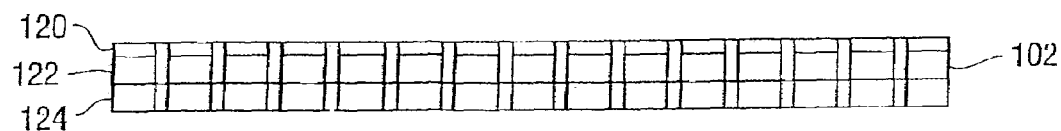
FIG. 1B is a schematic illustration of a workpiece surface influencing device.
Figure 2A:
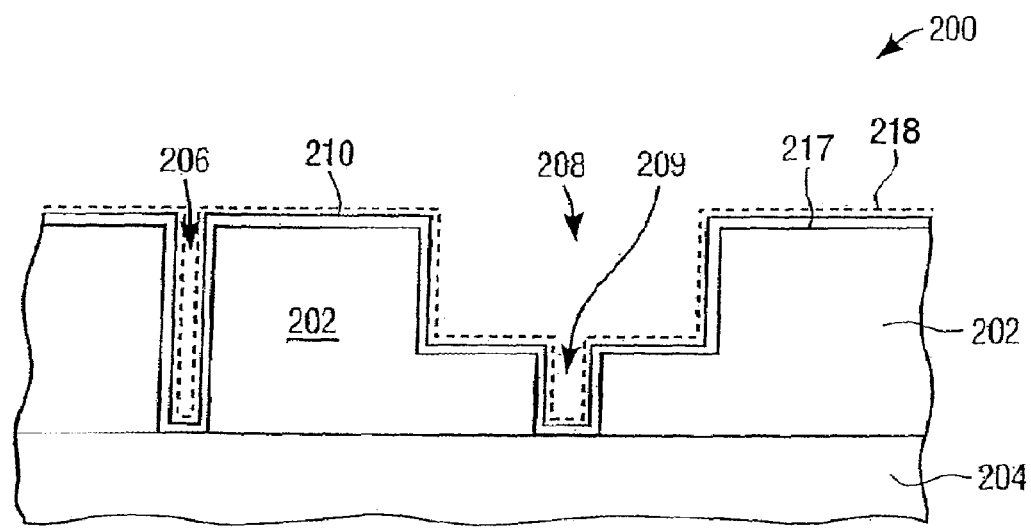
FIG. 2A is a schematic illustration of surface region of a substrate surface having features formed therein.
Figure 2B:
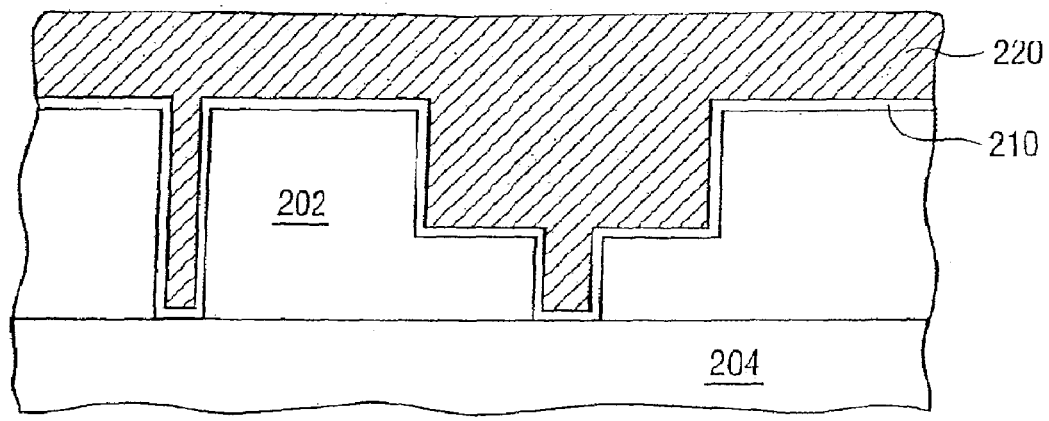
FIG. 2B is a schematic illustration of the substrate shown in FIG. 2A, wherein copper has been deposited on the substrate surface.

Details of the surface region of an exemplary substrate 200 to process with the present invention are shown in FIGS. 2A-2B. The substrate 200 comprises a patterned layer 202, preferably an insulating layer formed on a workpiece 204. The insulating layer may be comprised of an insulation material such as silicon oxide and formed using well-known patterning and etching techniques pursuant to metal interconnect design rules. In this embodiment, the insulating layer 202 may be comprised of cavities or gaps, namely the first cavity 206 and a second cavity 208 separated from one another by field region 210. In this embodiment, the cavities can be formed such that the first cavity 206 may be a via, the second cavity 208 may be a trench including a second via 209 at the bottom. Top surfaces 210 are also called field regions. One or more thin layers of barrier or glue layer 217 having materials, for example, Ta, TaN, Ti, TiN, or WN coats the cavities as well as the top surfaces. A thin film 218 of copper is coated as the seed layer on top of the barrier layer for the subsequent electroplated copper layer. The copper seed layer provides a base layer on which nucleation and growth of the subsequent deposition layer can be promoted. Referring to FIG. 2B, with the present invention, a planar copper layer 220 can be deposited into the cavities 206, 208, 209 and on the field region 210. The deposition process as well as other processes which are performed using the present invention described below.

Figure 3:
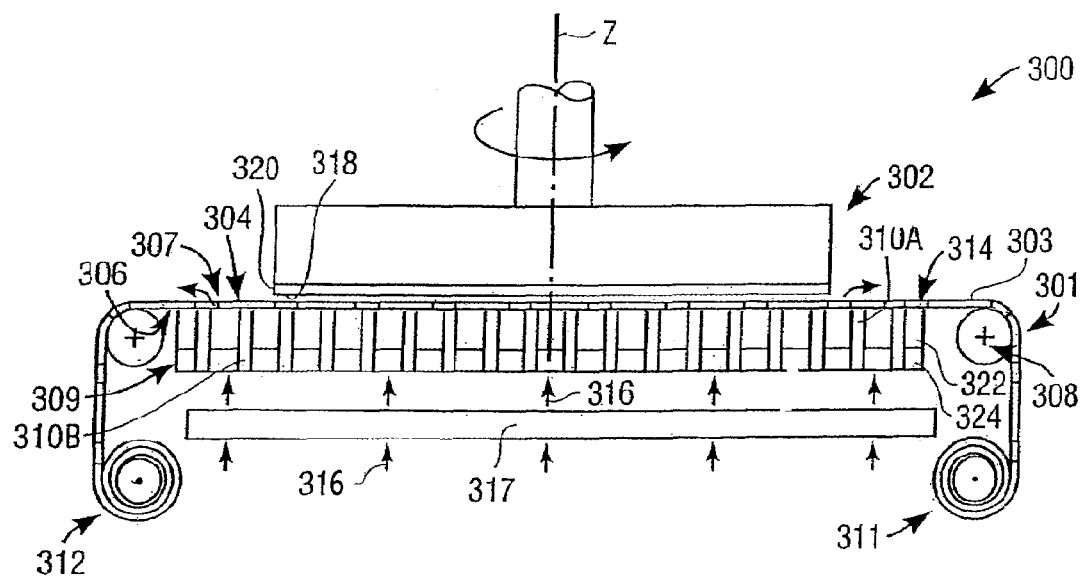
FIG. 3 is a schematic illustration of an ECMPR system employing a belt workpiece surface influencing device.

FIG. 3 shows an embodiment of an ECMPR system 300 comprising a belt WSID assembly 301 of the present invention and a carrier head 302. The belt WSID assembly 301 comprises a WSID belt 303 having an upper surface 304 or a process surface and a back surface 306 and a set of rollers 308. The WSID belt may be made of a flexible material and may preferably have an abrasive process surface for sweeping action. The belt WSID may have a plurality of openings 314 or channels allowing a process solution such as a plating electrolyte or the electroetching solution, depicted by arrows 316, to flow between an electrode 317 and a front surface 318 of a workpiece 320 or a wafer. For clarification purposes, the container or the cavity holding the process solution is not shown in the Figures. The front surface 318 of the wafer may comprise the exemplary substrate shown in FIGS. 2A-2B. As will be described below, the process surface of the belt 303 may also include raised surfaces to perform sweeping action (see FIG. 4B). The belt WSID 303 is moved on the rollers 308 for either in unidirectional or bi-directional linear manner by a moving mechanism (not shown). The belt WSID may be moved during electroetching or electrodeposition process in close proximity of the front surface of the wafer. The belt WSID may be moved on the front surface of the wafer to sweep the front surface during the electroetching or electroplating. The moving mechanism also appropriately tensions the belt WSID 303 to assure contact with the workpiece surface during ECMPR. The back surface 306 of the belt WSID 303 is placed on a top surface 307 of a plate 309. The plate 309 may be comprised of one or more layers. In this embodiment the plate 309 is comprised of an upper layer 322 and a lower layer 324. The upper layer 322 may be made of a compressible material. The bottom layer 324 is a support layer and is made of a rigid material so that it can support the compressible layer 322. Openings 310A in the compressible layer 322 and the openings 310B in the rigid layer 324 allow process solution to flow through the plate 309. Further, the compressible layer 322 may have the openings 310A or may be made of a porous material that allows process solution to flow though its open pores. The belt WSID 303 is tensioned on top surface 307 of the plate 309 so that the top surface 307 of the plate 309 fully contact with a bottom surface portion of the belt WSID 303 that covers the top surface 307. If needed, as the belt WSID 303 moved on the upper layer, the bottom surface of the belt WSID 303 slides on the upper surface of the plate 309 while the process solution 316 flows through both the plate 309 and the belt WSID 303.

The belt WSID may be made of a polymeric film such as a fixed abrasive film commonly used in CMP processes and available from 3M Company. The flexible material of the belt WSID is thin and having a thickness in the range of 0.2-2 mm. The belt WSID may also have a composite structure having multiplicity of thin layers. The belt WSID may have relatively flat surface such as the lapping films containing 0.05-0.5 micron size abrasive particles (available from e.g. Buehler or 3M companies), or small diameter posts with flat tops or pyramidal posts such as those employed in fixed abrasive pads provided by 3M company. The surface of the belt WSID is preferably abrasive to efficiently sweep the surface of the workpiece.

The upper layer 322 of the plate 309 is made of a foam or gel material, which is easily compressible under an applied force but recovers back to its original shape once the force is removed. The upper layer 322 of the plate 309 may have thickness in the range of 1-5 mm. Examples of such materials can be polyurethane, polypropylene, rubber, EVA, their mixtures and the like. The lower layer 324 of the plate 309 is a porous plate or it has many openings to let electrolyte and electric field freely flow towards the substrate surface. The lower layer 324 may itself be the electrode.

During the process, the wafer 320 is held by the carrier head in close proximity of the belt WSID such that the process solution flowing through the plate 309 and the belt WSID 303 wets the front surface of the wafer. As shown in exploded view in FIG. 4A, the wafer 320 processed over a predetermined area 321 or a process area of the process surface of the belt WSID 303. As the belt is tensioned over the upper surface 307 of the plate, the compressible layer pushes the belt upward. Additionally, if the wafer 320 is contacted with the process surface, the compressible layer pushes the process surface against the front surface of the wafer. The process area 321 is renewed by advancing the belt WSID such that a used process area is replaced by a fresh process area by rolling the used process area over the storage spool 312 and thereby drawing fresh process area from the supply spool 311. Advancement of the belt can be carried out after processing about 20-100 wafers or before the extensive use of the same area of WSID starts impacting the process results in a negative manner. Owing to this feature, the belt WSID 303 reduces manufacturing down time and increases system throughput. Alternately, it is possible to index or gradually advance the WSID by a small amount, such as in the range of 1-5 mm, for each wafer processed. During the process, the wafer carrier 302 can move the wafer on or above the belt WSID 303 laterally and rotate about the rotation axis z of the wafer carrier. As mentioned above, the belt WSID of the present invention can also be moved laterally while the wafer is moved on it by the carrier head. In another embodiment belt may be a loop shape or continuous belt which is rotated by rollers that replace storage and supply spools. Belt is placed around the rollers and tensioned. The rollers in this embodiment are rotated by a drive system and the rotational motion of the rollers cause belt to be moved linearly with respect to the wafer surface that is being processed.

Figure 4A:
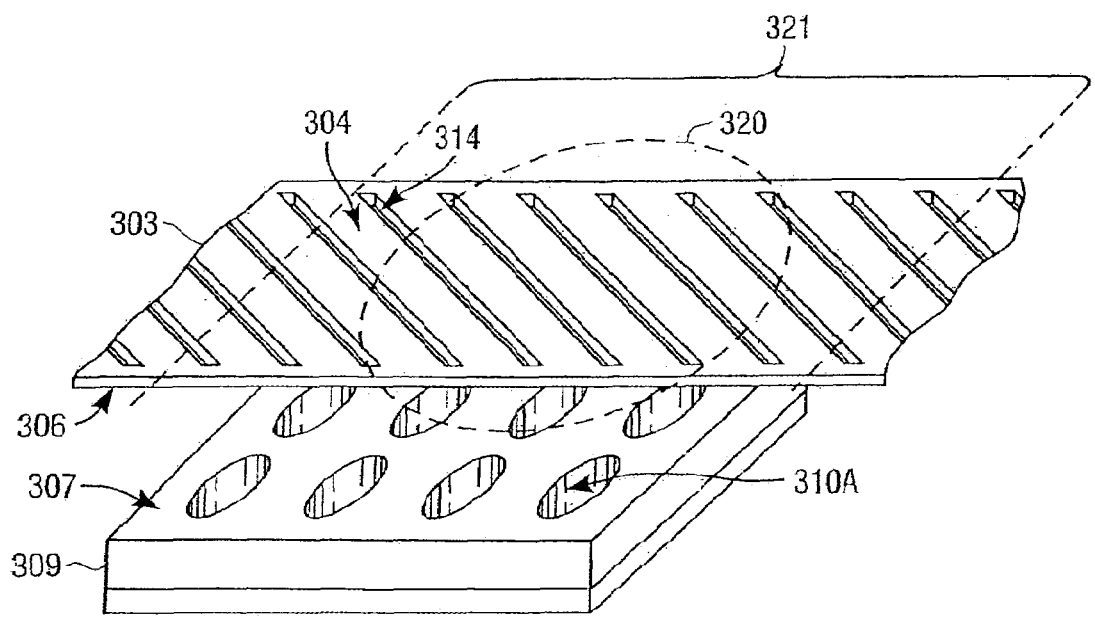
FIG. 4A is a schematic view of a process section of the belt workpiece surface influencing device.
Figure 4B:
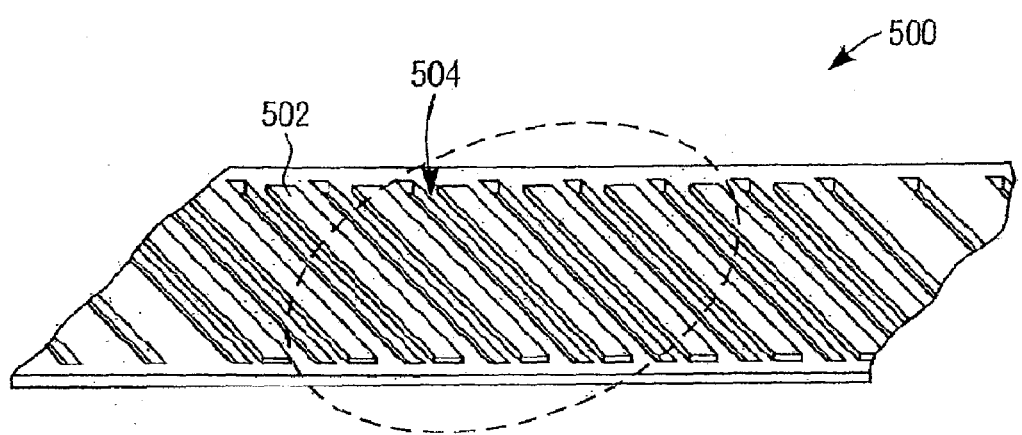
FIG. 4B is a schematic view of a surface of a process section of another belt workpiece surface influencing device.

As also shown in FIG. 4A, width of the belt WSID is preferably shorter than the diameter of the wafer to be processed. As will be described below, this feature of the belt allows electrical contact to be established between the front surface of the wafer and a power source (not shown). For chemical etching processes, width of the WSID may be equal to or larger than the diameter of the wafer, since there is no need to make electrical contact. The belt WSID may be a single layer or a composite layer made up more than one layer. If the belt includes more than one layer, those layers may or may not be the same size. However, the total thickness of such composite layer is typically 0.5-2 mm. As can be seen in FIG. 4B in perspective view, a WSID 500 may have a raised surface 502 which is smaller in comparison to the top surface 504 of the WSID 500. In this embodiment the sweeping function is performed by the raised surface 502. It is preferred that the raised surface 502 contains an abrasive layer.

The exemplary ECMPR system 300 of FIG. 3 is capable of performing planar or non-planar plating as well as planar or non-planar electroetching. In this respect, if non-planar process approach is chosen, the front surface of the wafer is brought into proximity of the process surface of the belt WSID 303, but it does not touch it, so that non-planar metal deposition can be performed. Further, if planar process approach is chosen, the front surface of the wafer contacts the process surface as a relative motion is established between the belt WSID and the front surface of the wafer. As the process solution is delivered through the openings in the belt, either the belt is laterally moved or the wafer is rotated and laterally moved, or both the belt WSID and the wafer are moved, while the front surface contacts the process surface. Under an applied potential between the wafer and the electrode, and in the presence of the process solution that rises through the belt WSID 303, the metal such as copper, is plated on or etched off the front surface of the wafer depending on the polarity of the voltage applied between the wafer surface and the electrode.

Figure 5:
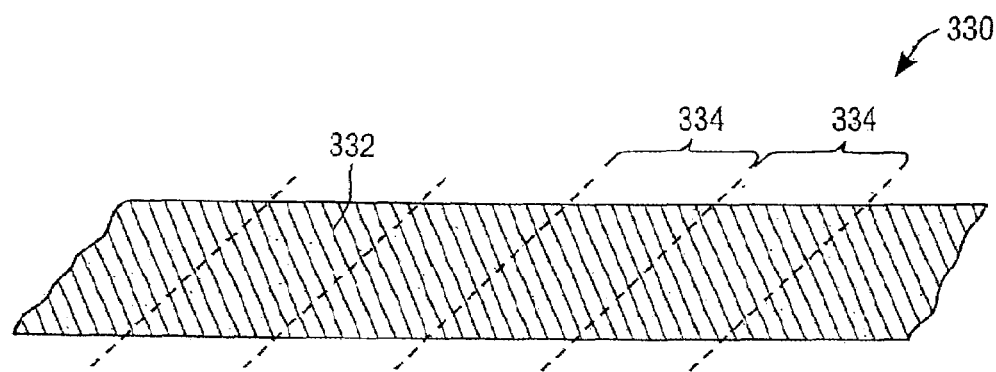
FIG. 5 is a schematic illustration of a workpiece surface influencing device with process sections having the same channel patterns, wherein the process sections are not spaced apart.
Figure 6:
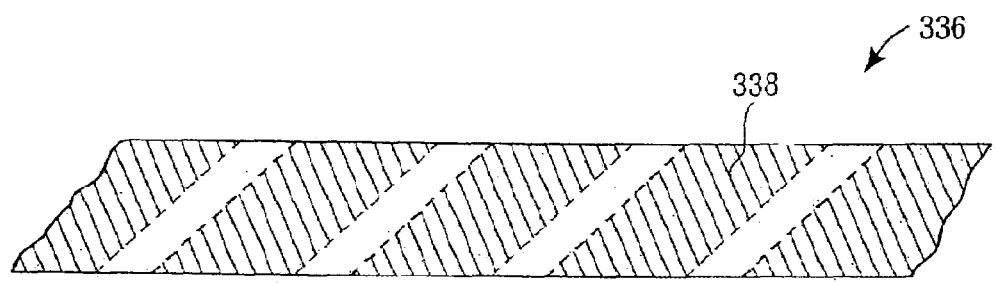
FIG. 6 is a schematic illustration of a workpiece surface influencing device with process sections having the same channel patterns, wherein the process sections are spaced apart.
Figure 7:
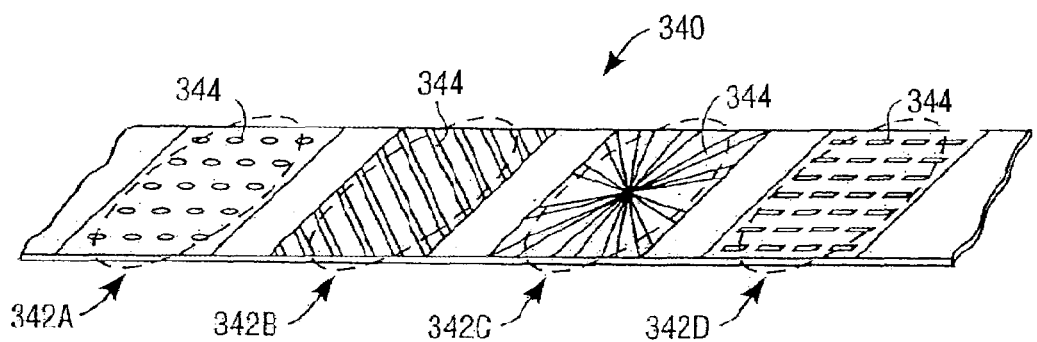
FIG. 7 is a schematic illustration of a workpiece surface influencing device with process sections having different channel patterns.

FIGS. 5 to 7 show various belt WSID process area designs. In accordance of the principles of the present invention, the belt WSID may have various grouped opening or channel patterns which are generally adapted either as a continuous pattern along the belt WSID or more than one pattern repeating along the belt WSID. As shown in FIG. 5, in one embodiment, a WSID belt 330 may have channels 332 which are formed in a continuous pattern extending along the belt WSID 330. In this particular design, channels 332 are shaped as parallel slits, although they may be shaped as holes or other openings in various geometrical shapes, or various radial designs. In this embodiment, depending on the process requirements and the wafer size, a plurality of process areas 334 can be extended end to end fashion. The belt WSID 330 can be moved laterally on the plate for the mechanical sweeping action. After certain number of wafer processing on the same processing area, the belt WSID is advanced to get a fresh process area. Alternately the belt can be moved incrementally in a specific direction during processing. This way an incremental fresh belt WSID portion is moved into the process area in a continuous manner.

As shown in another embodiment in FIG. 6, a belt WSID 336 may have channels 338 that are grouped in process areas that are separated from one another. After each use the process areas are advanced to replace them with the new ones. With such belt, the lateral motion is mainly provided by the wafer holder during the process.

Although the belt WSID may have a single channel pattern extending along the belt WSID, such as those shown in FIGS. 5 and 6, the belt WSID may also comprise a multiplicity of opening or channel patterns. As exemplified in FIG. 7, a belt WSID 340 may have a number of process areas 342A-342D that comprise channels 344, having different sizes and shapes, as well as raised surfaces on the process areas for the sweeping action. For example, the process area 342A comprises channels 344 shaped as round holes while the process area 342B comprises channels 344 shaped as slits. The process area 342C comprises channels 344 having a radial pattern, and the process area 342D comprises channels 344 formed as rectangular holes. Channels 344 in each process area 342A-342D may also differ in size and shape as well as in how they are distributed on that particular process area. Each process area may be repeatedly used for ECMD or ECME or chemical etching process purposes by advancing or recoiling the belt WSID for the particular process area. By giving a specific shape and distribution to the channels, the copper layer profile can be controlled. By employing a specific process area, the thickness profile of the copper layer can be made uniform or can be varied into a desired profile. For example, in an exemplary operation sequence, the wafer may be first ECMD processed on the process area 342A to deposit a planar copper layer. Subsequently, the same wafer may be ECME processed or chemically mechanically etched to etch back the planar copper layer on the process area 342B. In this example, the process area 342A may have a channel pattern that is suitable for ECMD process giving uniform deposition, and the process area 342B may have a pattern that is suitable for ECME or CME or chemical etching processes, yielding uniform material etching or removal.

Figure 8:
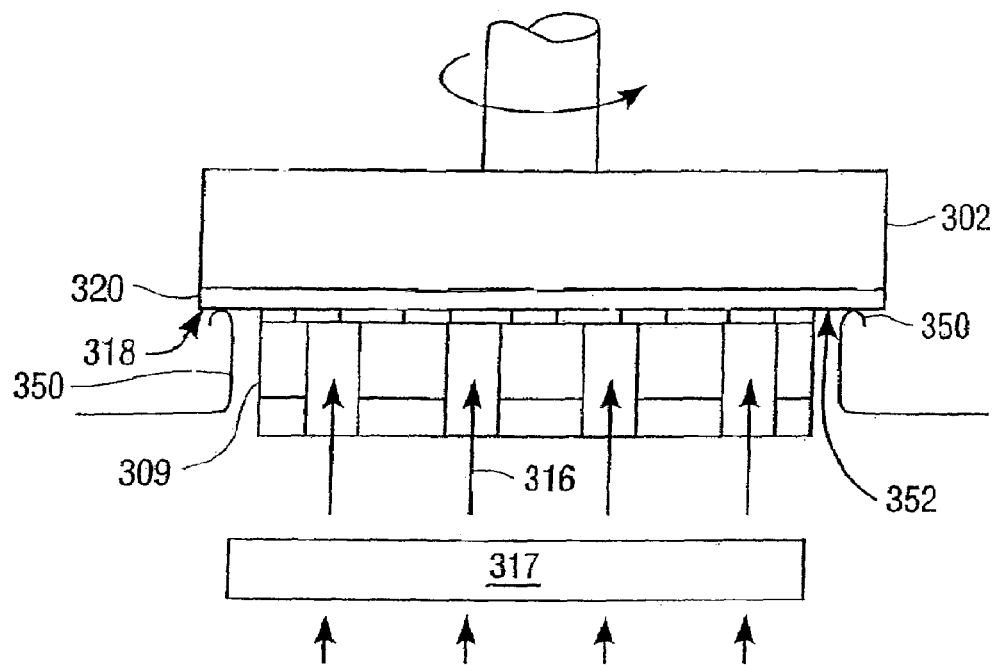
FIG. 8 is a schematic illustration of electrical contact locations in the ECMPR system shown in FIG. 3.

During the ECMPR an electrical potential is established between the front surface of the wafer and the electrode 317. As shown in FIG. 8 in a side view of the system 300, the front surface of the wafer 320 is connected to a power source (not shown) through contacts 350 touching and sliding on a peripheral region 352 of the front surface 318 of the wafer. Examples of such contacts are described in U.S. application Ser. No. 09/760,757, entitled Method and Apparatus for Electrodeposition of Uniform Film with Minimal Edge Exclusion on Substrate, filed on Jan. 17, 2001, now U.S. Pat. No. 6,610, 190, and U.S. Provisional Application 60/348,758, entitled "Method and System for Providing Electrical Contacts for Electrotreating Processes filed on Oct. 26, 2001," both of which are commonly owned by the assignee of the present invention.

Figure 9:
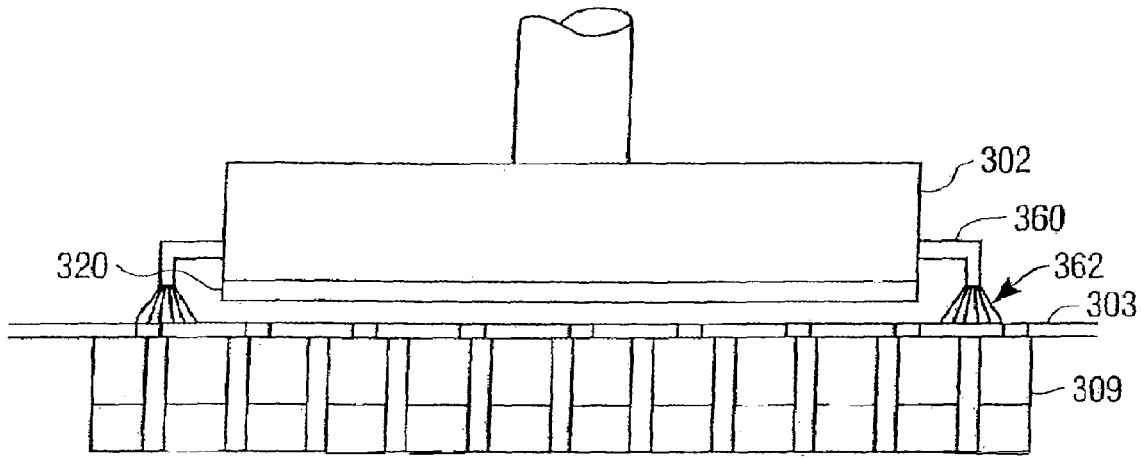
FIG. 9 is a schematic illustration of a conditioning device of the belt workpiece surface influencing device of the present invention.

During the process step that involves the WSID being in close proximity to, and typically in contact with, the front surface of the wafer, small particles of the metal on the front surface or the non-conductive particles from the sources may attach onto the WSID material. These particles may exist because of the fact that they may be just physically removed from the substrate surface or they may originate from the plating solution due to poor filtration of the plating solution. Such particles can be cleaned using the conditioning apparatus of the present invention. As shown in FIG. 9, the carrier head 302 may include a conditioning apparatus 360 with brushes 362. As illustrated, the brushes 362 are disposed around the periphery of the carrier head 302. The brushes 362 provide for conditioning of the WSID 303 by dislodging particles by mechanically sweeping them out. In this embodiment, the ECMPR process on the workpiece 320, whether ECMD or ECME, and conditioning of the WSID 303 can occur at the same time, during the same process. In this particular situation, in order to condition the entire WSID 303, the lateral movement of the carrier head 302 or the WSID 303 should preferably be equal or greater than the radius of the carrier head 302 so that the WSID portion that the carrier head covers can effectively be cleaned. Alternately the conditioning brushes are not attached to the head but they are placed, using suitable means, out of end of an area that is scanned by the lateral movement of the head. The belt may then be moved to assure that the entire length of the processing area is brushed by the conditioning brushes.

Figure 10A:
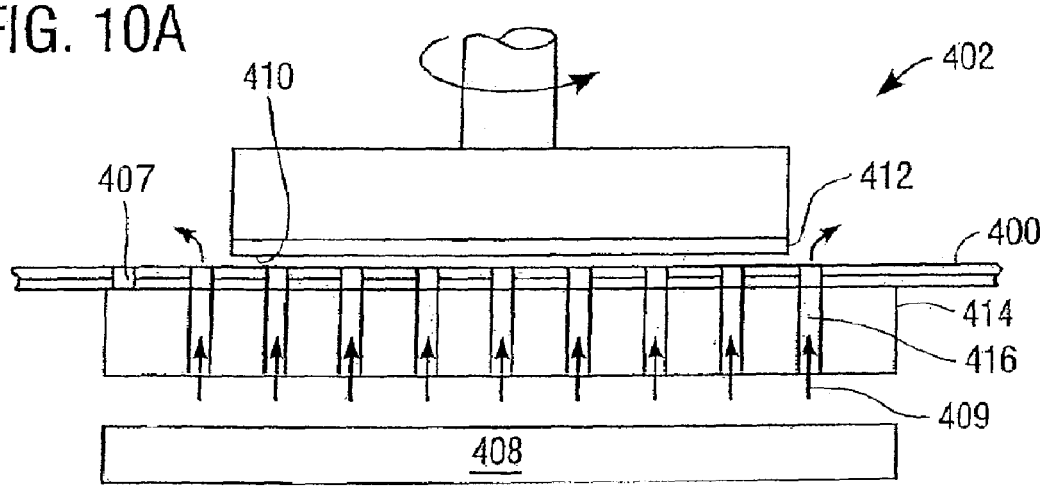
FIGS. 10A-12 are schematic illustrations of the belt workpiece surface influencing device systems.
Figure 10B:
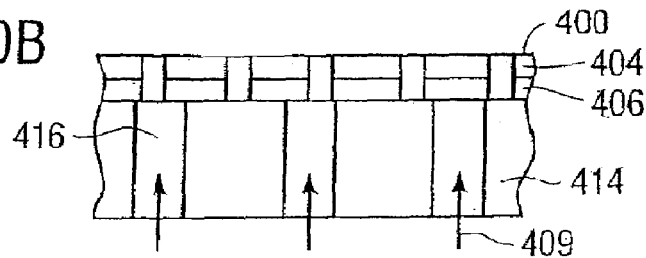

FIGS. 10A-12 shows various embodiments of the belt WSID. FIG. 10A shows a belt WSID 400 in an ECMPR system 402. As shown in detail in FIG. 10B, the belt WSID 400 is comprised of a bi-layer with a top layer 404 and a bottom layer 406 attached to the top layer 404. The top layer 404 may be an abrasive layer or a layer containing abrasives. The bottom layer 406 is a thin compressible layer. Channels 407 are formed through the belt 400 to allow a process solution 409 to flow through between an electrode 408 and a front surface 410 of a wafer 412. Referring to FIG. 10A, in use, the compressible layer 406 of the belt 400 is placed on a plate 414 of the system 402. The plate 414 in this embodiment preferably made of a rigid material. The plate 414 comprises channels 416 to allow process solution 409 to flow through the plate 414. During the process, the compressible layer 406 of the belt 400, which is supported by the rigid plate 414 of the system, pushes the belt 404 towards the wafer 412. In this embodiment, apart from the previous embodiment, the compressible layer 406 is an integral part of the belt WSID 400. The surface interface between the compressible layer 406 and the plate 414 is preferably a low friction interface in this example and the previous examples. For the belt 400 described above embodiment, the top layer 404 is typically 0.2-2 mm thick and the bottom layer 406 is typically 1-5 mm thick, which layers are glued together, with the channels 407 dimensioned to allow fluid flow therethrough.

Figure 11A:
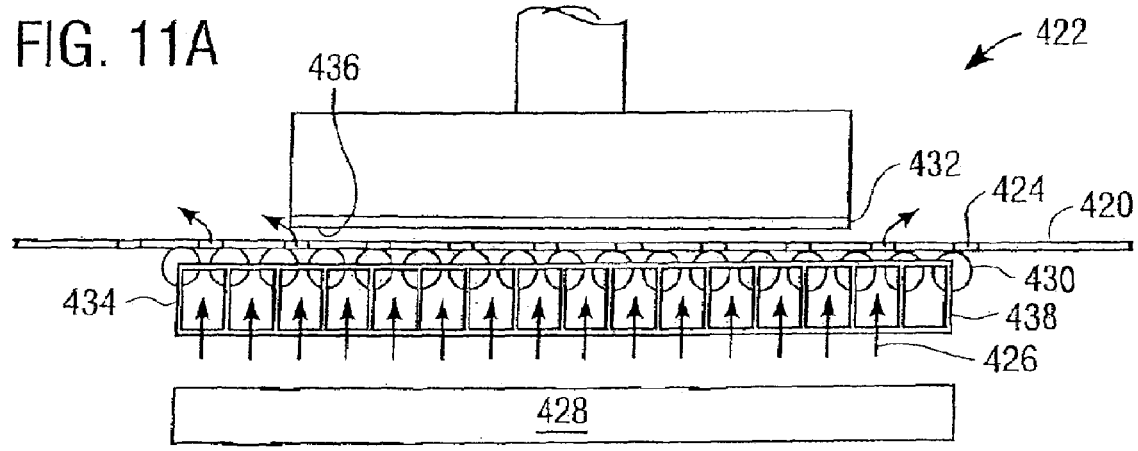
Figure 11B:
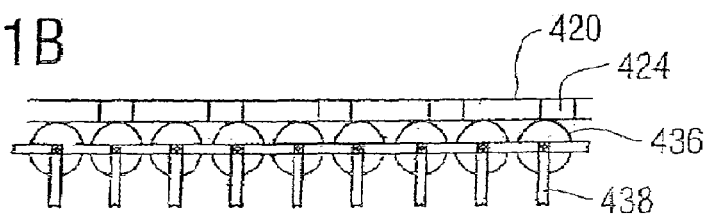

FIG. 11A shows a belt WSID 420 in an ECMPR system 422. As shown in detail in FIG. 11B, the belt WSID 420 is comprised of a single layer which may be an abrasive layer or a layer containing abrasives. Channels 424 are formed through the belt 420 to allow a process solution 426 to flow through between an electrode 428 and a front surface 430 of a wafer 432. Referring to FIG. 11A, in use, the belt 420 is placed on a roller system 434 having a plurality of rollers 436 placed on a frame 438. The frame is immersed in the process solution and allows the passage of the process solution through the roller system. Rollers are placed side by side along the width of the belt and they are able to move up and down when the wafer contacts the belt during the process. During the process roller system pushes the belt against the wafer and acts like a compressible layer shown in the previous embodiments. Roller surfaces may preferably contain a compressible material to establish contact between the wafer surface and the belt surface.

Figure 12:
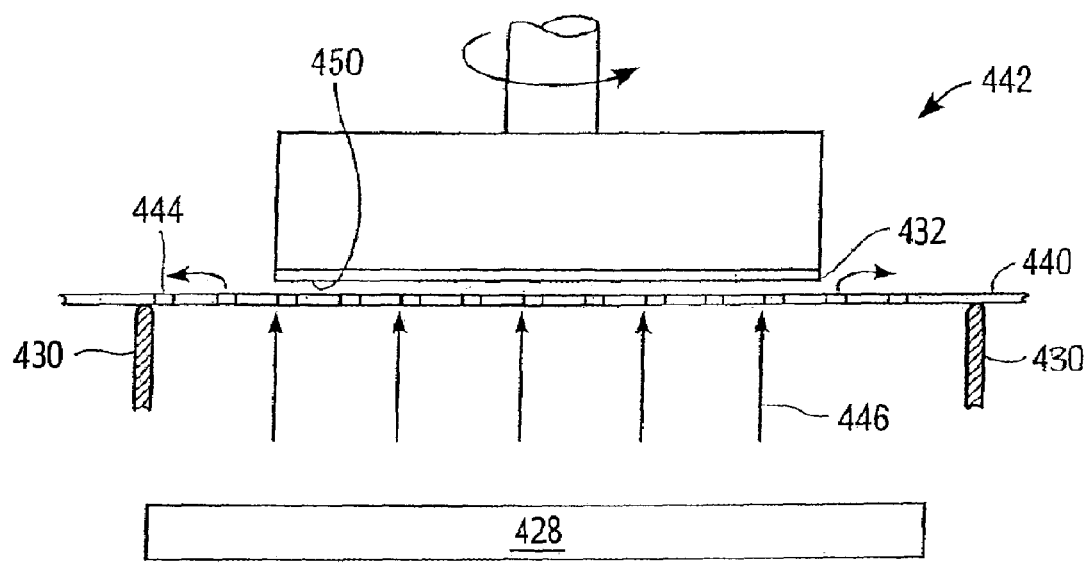

FIG. 12 shows a belt WSID 440 in a ECMPR system 442. The belt WSID 440 is comprised of a single layer that may be an abrasive layer or a layer containing abrasives. Channels 444 are formed through the belt 440 to allow a process solution 446 to flow through between an electrode 428 and a front surface 430 of a wafer 432. The process solution is held in a container (not shown). The belt is supported on top ends 450 of side walls the container during the process. In addition to that, the flow pressure of the process solution process pushes the belt against the wafer while providing additional support. Pressure of the solution acts like a compressible layer shown in the previous embodiments.

Figure 13A:
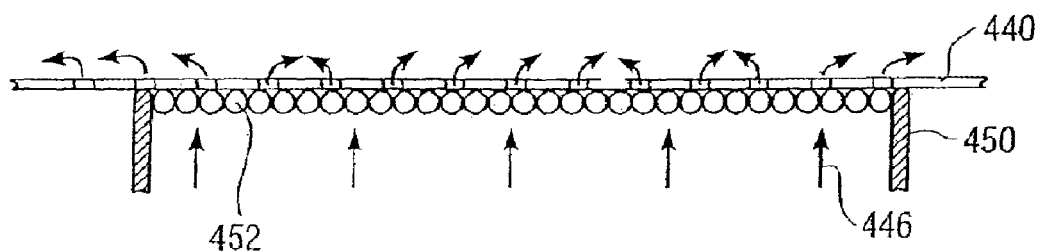
FIGS. 13A-13C are schematic illustrations of alternative belt support means.
Figure 13B:
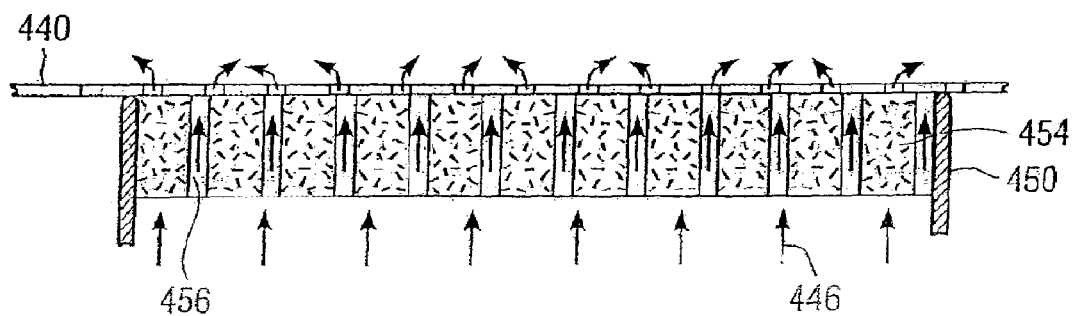
Figure 13C:
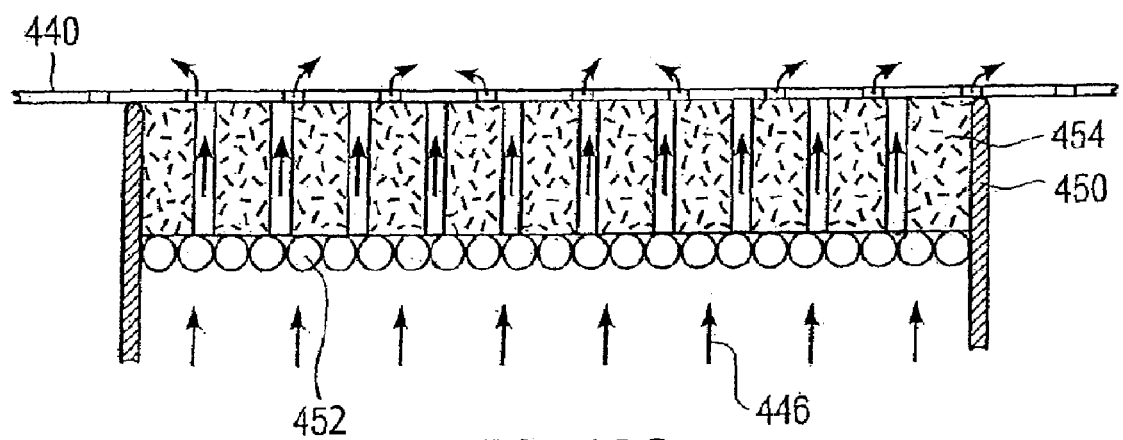

FIGS. 13A-13C illustrate various additional mechanisms to support the belt 440 that is shown in the embodiment described with help of FIG. 12. As shown in FIG. 13A, the belt WSID 440 may also be supported by a plurality of hollow spheres 452 located under the belt 440 and floating on the process solution 446 while confined by the wall tops 450 of the process container. The spheres may be filled with a gas such as air or a lighter gas. In addition to the pressure of the solution, spheres 452 adds an additional compressible support to the belt.

In FIG. 13B, the same can be achieved using a floatable layer 454, placed under the belt 440, having channels 456 to allow process solution 446 to flow through it. The floatable layer 454 may be made of a sponge like material such polyurethane. The floatable layer may also have air pockets (not shown) in it. Further, as illustrated in FIG. 13C, both the floatable layer 454 and the spheres 452 are placed under the belt 440 for the same purpose.

Figure 14A:
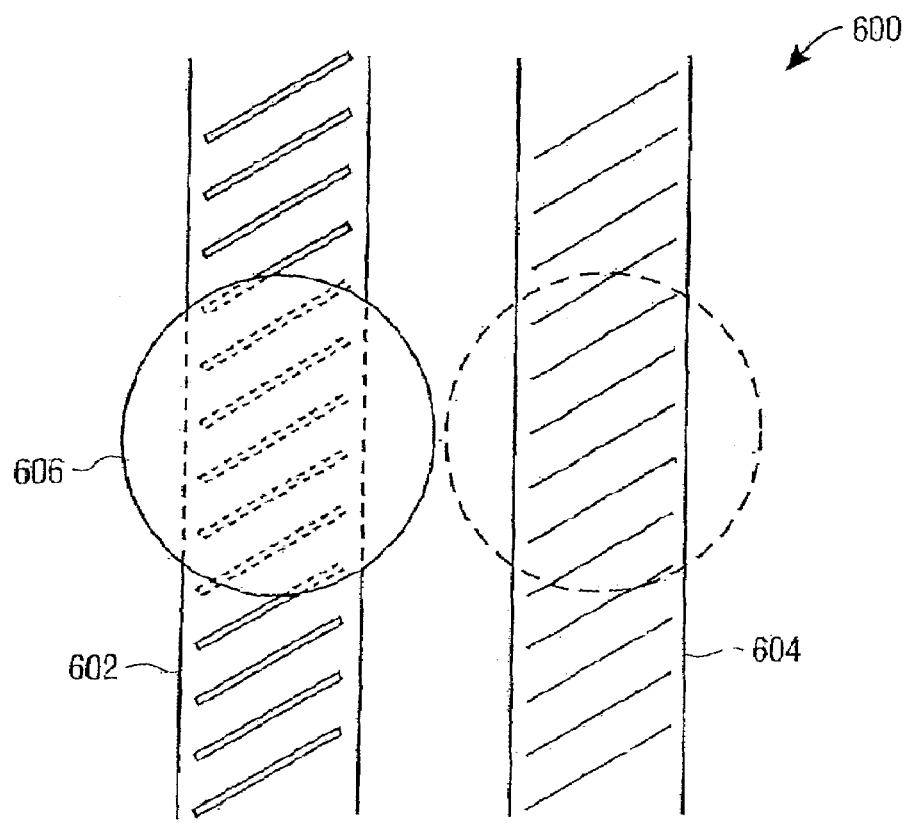
FIGS. 14A-14B is a schematic illustrations of a multiple workpiece surface influencing device system.
Figure 14B:
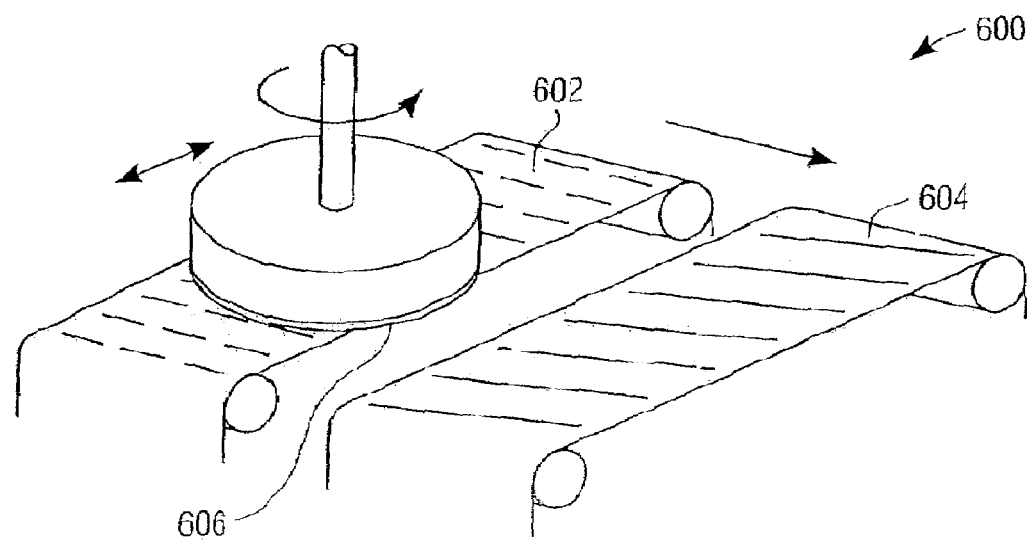

FIGS. 14A and 14B show a multiple WSID system 600 comprising a first belt WSID 602 and a second belt WSID 604 which is located adjacent the first belt WSID. The system 600 may have more than two WSID belts if needed. The system 600 allows a wafer 606 to be processed on both belts 602 and 604 during the process. The belts 602, 604 may have the repeating channel patterns shown in FIGS. 5 and 6. The belts may also have different channel patterns designed for different thickness distributions. For example, a first step of the process can be done using ECMD on the first belt 602 in a way that yields edge thick deposit profile. Then, the belt 604 can be used for an ECME step to reduce the overall thickness of the deposit. The pattern of the belt 604 may be such that more material can be etched from the edge portions to yield uniform thickness profile. If needed process may be continued on the first belt and vice versa.

In the following embodiments, various ECMPR systems including belt WSID, or belt pad may be used for electrochemical polishing, electrochemical mechanical polishing or chemical mechanical polishing of conductive surfaces on workpieces or wafers. In the following system descriptions the general construction of the ECMPR systems are similar to the ECMPR system 300 of FIG. 3. However, in the following embodiments, various alternative belt pad designs and surface electric contact designs will be described. Such designs improve uniformity of polished and planarized surfaces and increase product yield. Although the following embodiments will be stressing electropolishing and especially electrochemical mechanical polishing or planarization aspects of the present invention, the same system and the components can be used for electroplating of wafers and this aspect is within the scope of this invention.

Figure 15A:
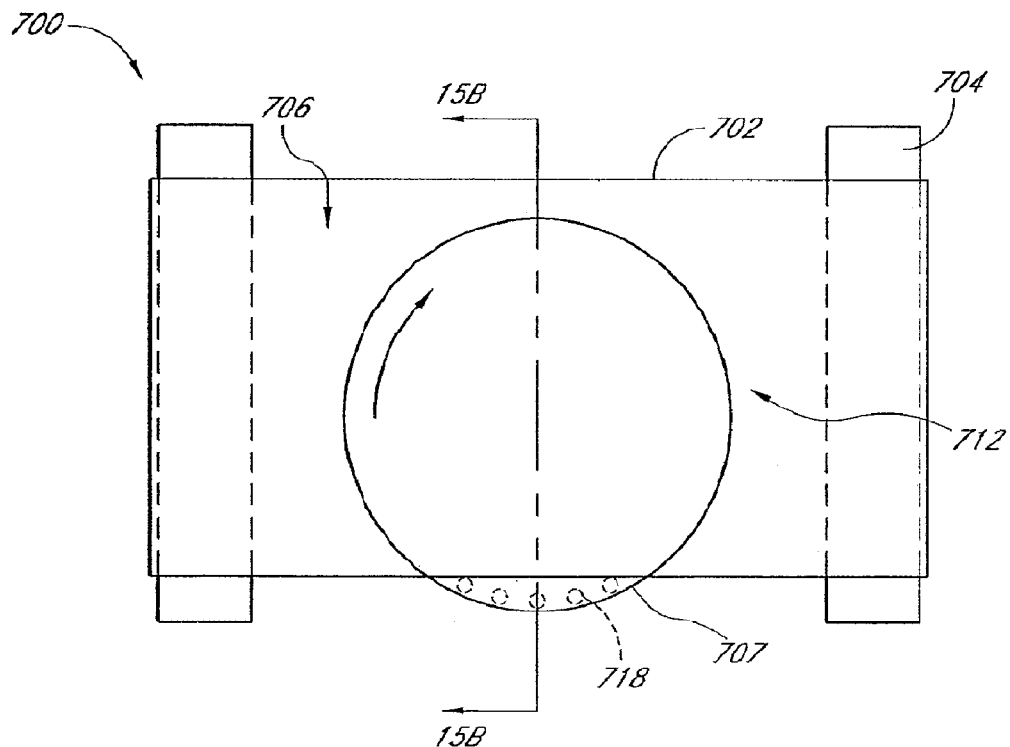
FIGS. 15A-15B are schematic illustrations of an embodiment of a system of the present invention using single side edge contacts.
Figure 15B:
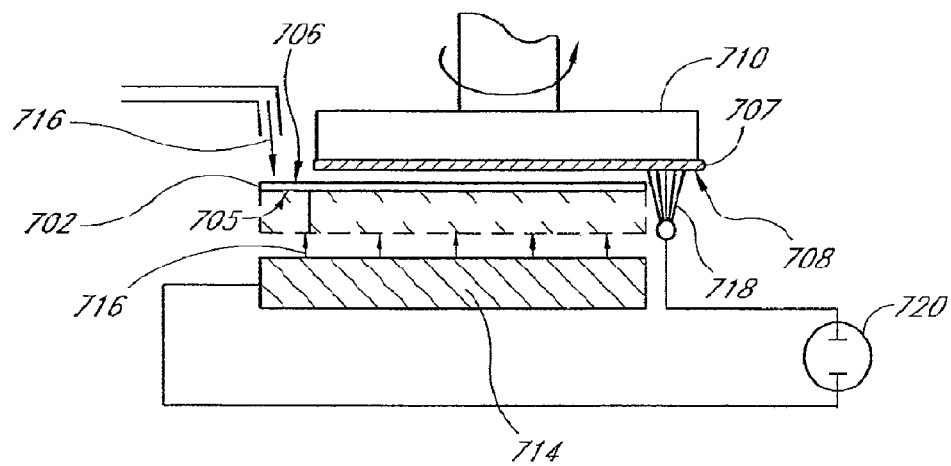

FIGS. 15A-15B schematically show, in a top view and a side view, an ECMPR system 700 comprising a belt WSID 702 or belt pad. The belt pad may be a porous pad or a pad with openings (not shown). The openings may be configured into patterns. The belt pad 702 may be tensioned and moved on supports 704 which may be rollers in this embodiment. The supports may contact a back surface 705 of the belt pad while the top surface 706 or the polishing surface of the belt pad 702 is used for processing a wafer 707. As described above, top surface 706 or polishing surface is comprised of a film or layer which is capable of polishing the conductive surface of the wafer. The polishing surface may be made of a commonly available polymeric CMP pad materials (such as those provided by companies such as Rodel) or a fixed abrasive layers such as the polishing pads provided by 3M. As described above, the belt pad may be made of more than one layer and/or the polishing surface may be disposed on a compressible layer.

The wafer 707 having a conductive surface 708 is retained by a carrier 710 which brings the surface into contact with a process area 712 of the polishing surface 706 of the belt-pad or places the surface in proximity of the process area 712. The conductive surface of the wafer may comprise copper and the copper layer on the wafer surface may be a planar or non-planar layer depending on the deposition process used. For example, ECMD processes yield planar copper deposits on wafer surfaces comprising cavities. ECD processes yield non-planar copper deposits. If the copper layer is non-planar, the electrochemical mechanical polishing or planarization approach of the present invention has the capability to planarize the copper layer as it removes the unwanted overburden portion from the wafer surface.

As described above, in one embodiment, the belt pad 702 may be released from a supply spool and picked up by a storage spool (FIG. 3) or it may be an endless loop. In this embodiment, the belt pad 702 may be moved linearly in unidirectional or bi-directional manner. The belt pad may be placed on a support plate which may be made of a conductor or an insulator. Surface of the support plate may include a compressible layer, or a buffer layer if the belt pad does not include one.

Alternatively, electrode 714 of the system 700 may be used as a support plate for belt pad. As shown in FIG. 15B, in a first position (shown with dotted-line shape), the electrode 714 may be placed against the back surface 705 of the belt pad 702, or in a second position (shown as solid-line shape) it is placed adjacent the belt pad and immersed into the process solution 716. In this respect, the process solution 716 such as an electropolishing or planarization solution may be delivered onto the belt pad or delivered through the belt pad to contact the surface of the wafer. In either way the solution is in contact with the electrode 714.

As described in the previous embodiments, the process area is a polishing surface portion where the processing of the surface occurs. The process area is the predetermined length of the polishing surface of the belt pad that is used for processing of the wafers. After using the process area of the belt pad for processing a predetermined number of wafers, the process area can be replaced by releasing unused belt portion from the supply spool while taking up the used portion over the storage spool. Alternately the process area may be the whole belt if a unidirectional linear motion is imparted to the belt, i.e. the belt pad is in the form of a loop. In case the belt pad moves in bi-directional linear way, the portion of the belt pad that makes contact with the wafer surface defines the process area. The belt pad may be porous or may include openings or channels. The openings or channels, as described above, may be configured into certain patterns to affect material removal rate and removal profiles. Each predetermined process area length of the belt pad may have the same opening pattern or different patterns affecting material removal rate. For example a belt pad having a first process area with a first pattern of openings removes copper with a first removal rate. Similarly, a second process area of the belt pad with a second opening pattern removes the material with a second removal rate. The opening patterns also affect the removal profiles, using certain patterns control the removal profile by providing an edge high or center high or uniform removal profiles.

As exemplified above with reference to, for example, FIG. 3, electrical connection to the wafer surface is generally made through the surface contacts touching the wafer surface along the edges of the long sides of the belt pad. An alternative surface contact configuration may be illustrated in FIGS. 15A-15B. Surface contacts 718 are located adjacent one side of the belt pad so that they can touch the edge of the surface 708 only at that side as the wafer is rotated over the polishing layer and the surface is electropolished or planarized. The surface contacts 718 and the electrode 714 are connected to a power supply 720 which applies a potential difference between them. This configuration of the surface contacts 718 will be referred to as single side surface contact. As well known by people trained in the field for electropolishing or planarization, the wafer is made more anodic compared to the electrode. For electroplating, the wafer is made more cathodic with respect to the electrode.

The single side surface contact configuration of the present invention may alleviate (compared to two-side surface contact configuration) any small material removal differences between the edge region where the electrical contacts are made and the center/middle region of the surface. Such differences may give rise to a lower material removal rate for an electropolishing process a lower material deposition rate for an electroplating process. The reason is the fact that although a very limited area is touching the contacts at any given time, a portion of the edge of the surface intermittently leaves the process area on the polishing surface to be contacted by the contacts 718. Therefore, that portion of the wafer surface does not get processed during the brief period it stays off the polishing surface. For electropolishing, for example, this causes less material removal from the edge region in comparison to the centers which is always on the process area of the polishing surface 706 and which is electropolished without interruption.

Figure 16:
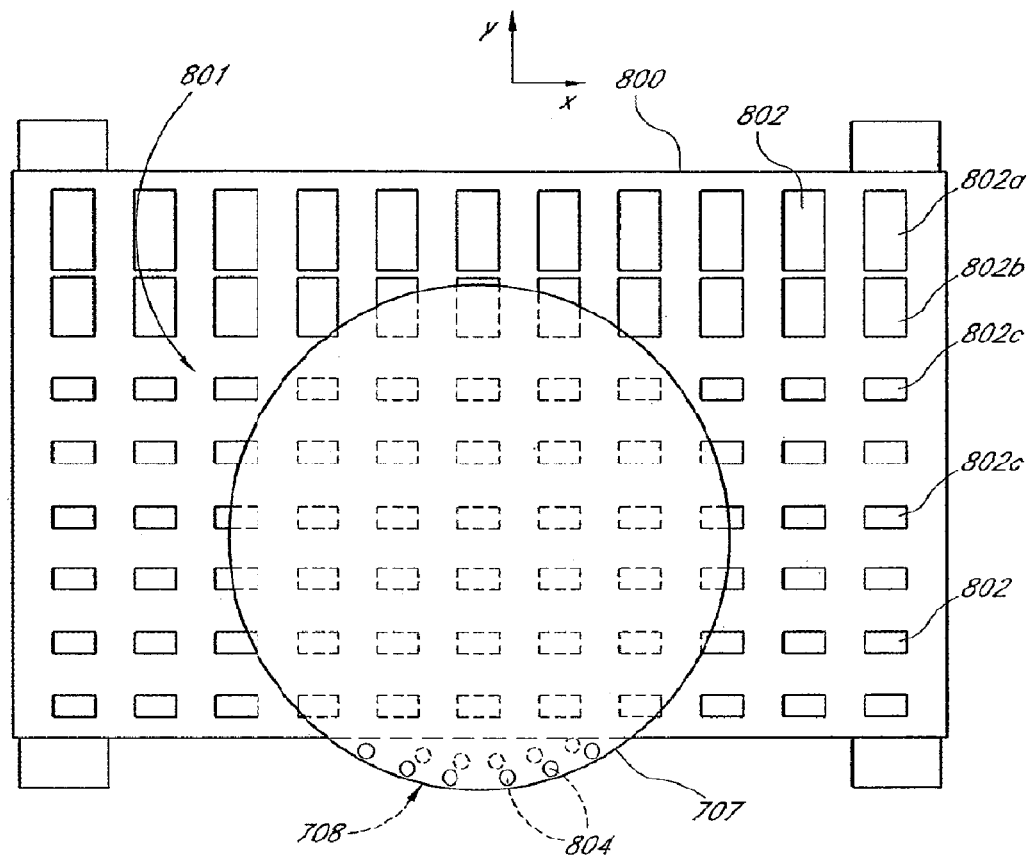
FIG. 16 is a schematic illustration of an embodiment of the present invention using single side edge contacts and a belt pad with variable size openings.

In one embodiment of the present invention, the material removal difference between the edge and the center regions in the wafer 707 may be further alleviated or eliminated by employing openings in the belt pad, preferably openings with varying size and shape. The openings may be configured in various sizes and patterns, as described above. FIG. 16 illustrates a belt pad 800 including a polishing surface 801 with openings 802 which may expose the underlying surface of a system electrode (not shown). In this embodiment, surface contacts 804 are in single side contact configuration, i.e., located at one of the long sides of the belt pad 800 to establish electrical connection with the edge of the surface 708 of the wafer 707. The wafer 707 may be retained by a carrier head but, for clarity, it is omitted in the figures.

The openings 802 may have more than one size such as a first size openings 802A, a second size openings 802B and third size openings 802C. The first size openings are the largest so they enable highest material removal. The second size openings 802B are made larger than the third size openings 802C to increase material removal from the edge of the surface of the wafer 707 during the electropolishing, which compensates with the amount that is not removed because of the above explained discontinuous electropolishing of the edge region. Material removal rate from the second openings 802B is higher than the third openings 802C. Accordingly, the polishing layer is such designed that the second size openings 802B are placed on the path of rotating or laterally moving surface. By moving the wafer with y-motion as shown in FIG. 16, the edge of the wafer 707 may be exposed to first size openings 802A with high removal rate to have the desired edge profile.

In this embodiment, the first and second openings are located across the surface contacts, at the opposite side of the belt pad. During the electropolishing, as a relative motion is established between the wafer and the polishing surface 801 of the belt pad, the material removal rate at the edge of the surface is higher when the edge of the surface passes over the second openings 802B. Material removal from the central region is always the same because the central region of the surface is always on the second openings 802C. Control of material removal by employing different size openings produces a uniform electropolishing profile on the surface 708 of the wafer 707 as the material is removed from the surface. It should be noted that the shapes of openings in FIG. 16 is only for representing the concept. Openings for uniform processing may be in the form of holes, slits or other shapes.

Figure 17:
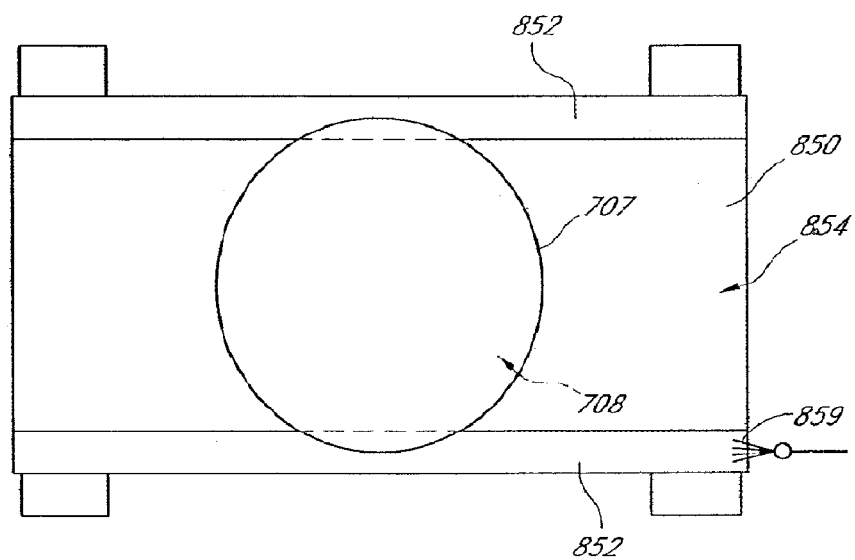
FIG. 17 is a schematic illustration of an embodiment of the present invention using double side embedded edge contacts with a belt pad.
Figure 18A:
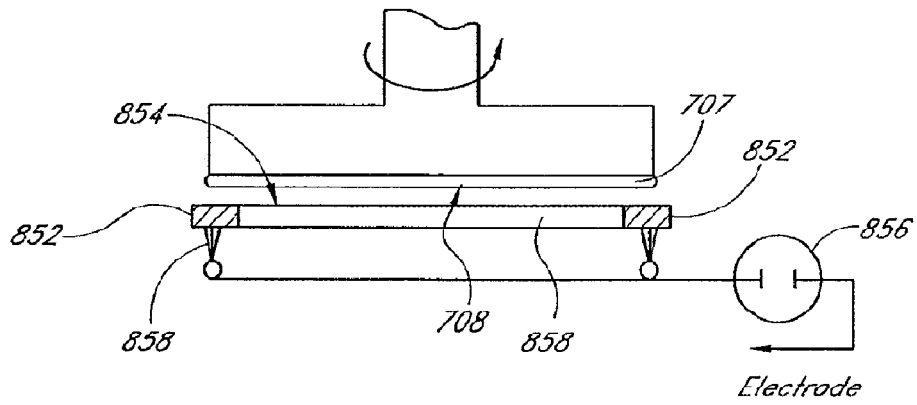
FIGS. 18A-18B are schematic side views of the embodiment shown in FIG. 17.
Figure 18B:
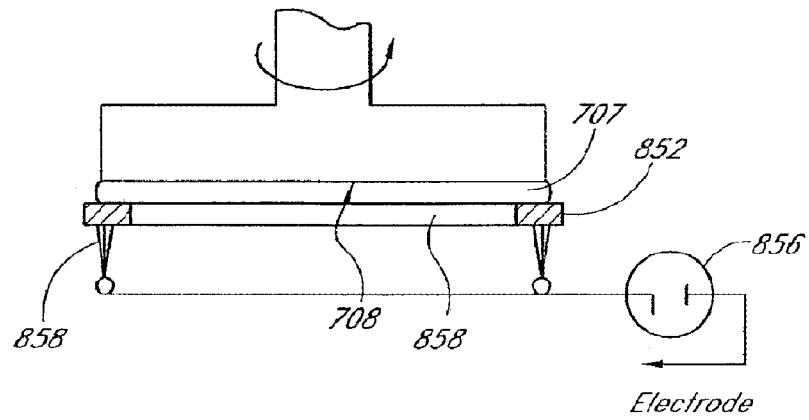

In the above embodiments described, surface contacts are generally secured on a system component next to the belt pad. The surface contact illustrated in the following embodiment overcome this limitation and are advantageously disposed in proximity of the polishing surface of the belt pad. As illustrated in FIG. 17, another embodiment of an exemplary belt pad 850 may have double-sided embedded surface contacts 852, or embedded surface contacts, extending along both long sides of the polishing surface 854. The embedded surface contacts may be made of thin flexible conductive strips attached along both sides of the belt pad. As illustrated in FIG. 18A, in side view, when the surface of the wafer is brought in proximity of the polishing surface, the edge of the wafer is partially located on the embedded surface contacts. As the surface is placed on the polishing surface or the process area, as shown in FIG. 18B, the electrical connection between the embedded surface contacts and a power supply 856 is established. Contact members 858, such as conductive brushes, may be used to connect the surface contacts to the power supply. Brushes 858 establish a continuous connection between the embedded surface contacts and the power supply during the electropolishing process. Alternatively, as exemplified in FIG. 17, electricity may be coupled to the embedded surface contacts 852, from the top using fingers 859, rollers, brushes, pins and the like.

Referring back to FIG. 18A, with this surface contact configuration, when the surface 708 of the wafer 707 is placed at a predetermined distance away from the polishing surface 854 of the belt pad, electrical connection between the edge of the surface of the wafer 707 and the embedded contacts 852 may be established through the process solution in between them. In this case, electrical connection between the embedded contacts and the surface of the wafer occurs without physically contacting the embedded surface contacts and the surface of the wafer.

Figure 18C:
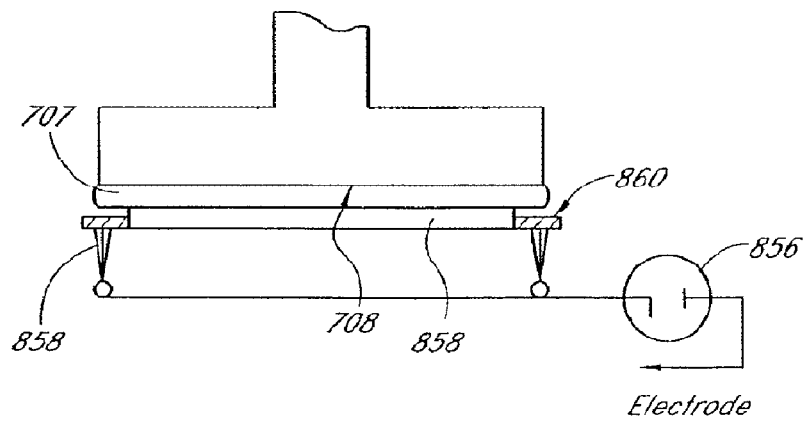
FIG. 18C is a schematic side view of the embodiment with non-touching double side edge contacts.

FIG. 18C shows another example of embedded surface contacts 860 which may be placed below the level of the polishing surface 854 to establish electrical connection through the process solution. In this embodiment, as the surface of the wafer is polished by the polishing area, electrical connection to the conductive surface is provided through the process solution between the embedded surface contacts 860 and the edge of the surface 708. In the embodiments above described in FIGS. 17-19, the belt pad may include openings, preferably varying size openings. Keeping the principles described in FIG. 16 in mind, larger openings may be placed along the path of the edge of the surface of the wafer to compensate material removal differences between the edge and center regions of the surface of the wafer 707.

Figure 19:
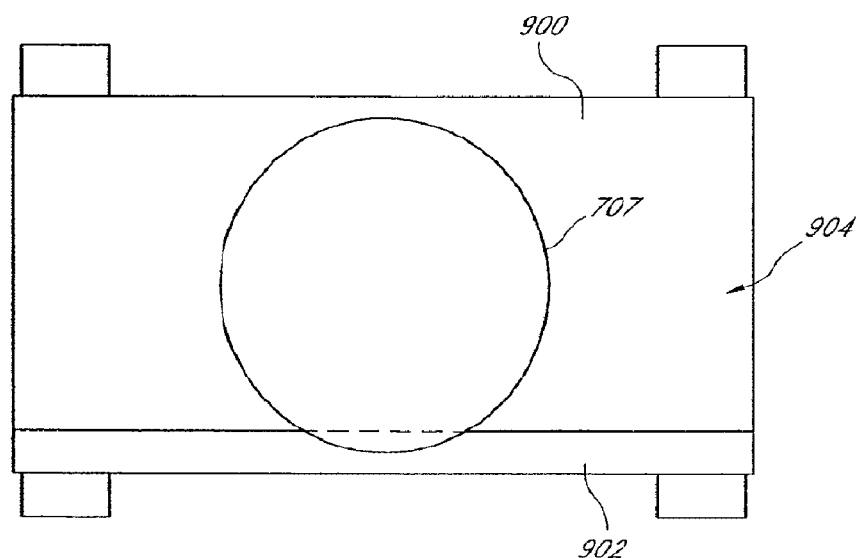
FIG. 19 is a schematic illustration of an embodiment of the present invention using single side embedded edge contact with a belt pad.

FIG. 19 illustrates a belt pad 900 having a singe side embedded surface contact 902 located at one side of the polishing surface 904. In this embodiment, the embedded surface contact 902 functions the way embedded surface contacts 852 described above but at one side of the polishing pad. Alternatively, the approach described in FIG. 18Cc an be applied to the one side contact, and they may be placed below the level of the polishing surface for electrical connection through the solution.

Figure 20:
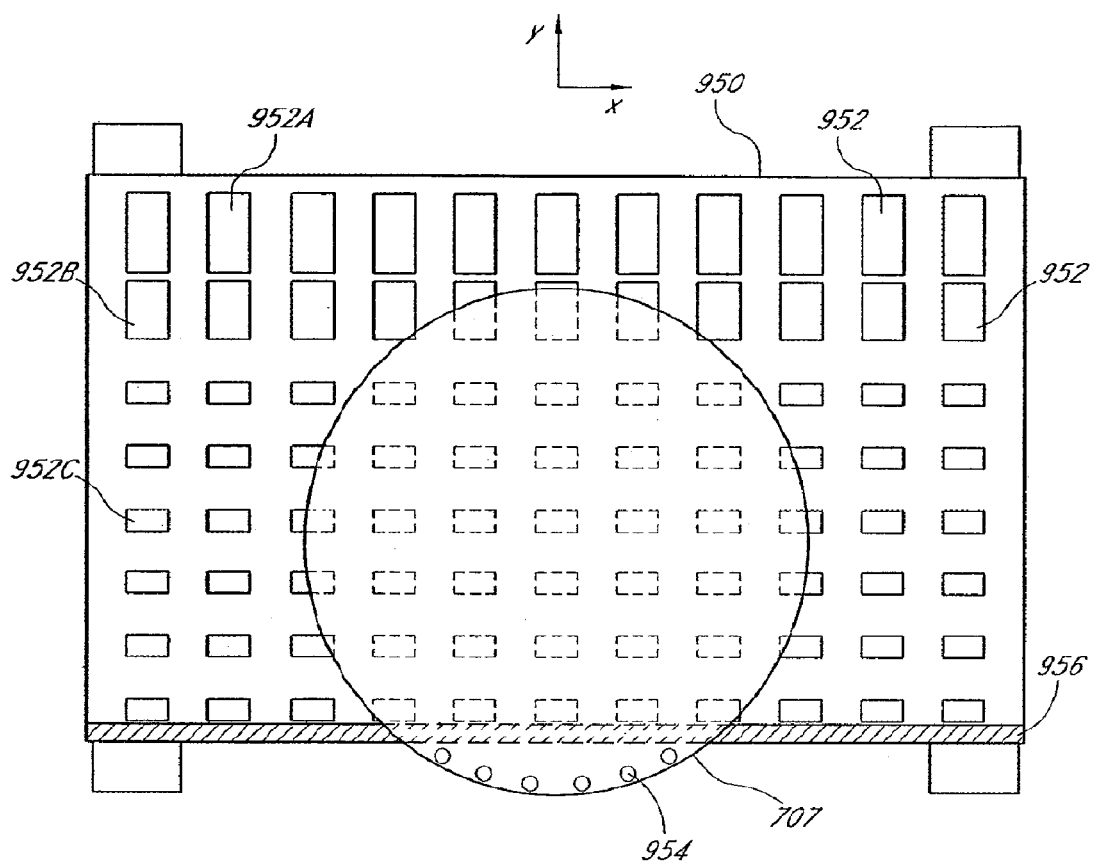
FIG. 20 is a schematic illustration of an embodiment of the present invention using single side edge contacts and a belt pad with variable size openings and a single side embedded edge contact.

FIG. 20 is a hybrid structure of the embodiments described in connection to FIGS. 16 and 19. In this embodiment, the belt pad 950 comprises openings 952 such as 952A, 952B and 952C. Electrical connection to the surface to the wafer 707 maybe established using single side surface contacts 954 and single side embedded surface contact 956. During the process, the surface contacts 954 and embedded surface contacts 956 can be used together or by themselves depending on the motion of the wafer. For example if the wafer is moved in y-direction to expose the edge to the large openings 952A, only embedded surface contact can be used to establish electrical connection to the wafer surface.

Although various preferred embodiments have been described in detail above, those skilled in the art will readily appreciate that many modifications of the exemplary embodiment are possible without materially departing from the novel teachings and advantages of this invention.

We claim:

1. An apparatus for electroprocessing a wafer using a solution, the apparatus comprising:
   a wafer carrier configured to hold the wafer;
   a belt pad comprising an embedded electrical contact, the belt pad being positioned relative to the wafer carrier such that the embedded electrical contact is configured to contact the wafer held by the wafer carrier only at an edge region of a front surface of the wafer, wherein the pad belt includes a plurality of openings, wherein the openings in a side of the belt pad opposite to the embedded electrical contact are larger than the openings in the central region of the belt pad;
   an electrode proximate to the belt pad and configured to be in contact with the solution; and
   a power supply configured to apply an electrical potential difference between the electrode and the embedded electrical contact.

2. The apparatus of claim 1, wherein the belt pad has one side edge along which there are no embedded electrical contacts.

3. The apparatus of claim 1, wherein the belt pad further comprises a second embedded electrical contact.

4. The apparatus of claim 3, wherein the embedded electrical contacts are substantially parallel to one another.

5. The apparatus of claim 3, wherein the openings in a side of the belt pad opposite to the second embedded electrical contact are larger than the openings in the central region of the belt pad.

6. The apparatus of claim 1, wherein the embedded electrical contact is below a polishing surface of the belt pad.

7. The apparatus of claim 1, wherein the power supply is configured to render the wafer cathodic with respect to the electrode.

8. The apparatus of claim 1, wherein the openings are configured to compensate for differences in processing rate at the edge region of the wafer and a central region of the front surface of the wafer.

9. The apparatus of claim 1, wherein the openings in a side of the belt pad opposite to the embedded electrical contact have a different shape than the openings in the central region of the belt pad.

10. The apparatus of claim 1, wherein the embedded electrical contact extends along the length of the belt pad.

11. The apparatus of claim 1, wherein the electrode is below the openings of the belt pad.

12. The apparatus of claim 1, wherein the openings are configured to allow the solution to flow therethrough from the electrode to the wafer.

13. The apparatus of claim 1, wherein the electrode touches a back surface of the belt pad.

14. The apparatus of claim 1, wherein a width of the belt pad is less than a diameter of the wafer.

15. An apparatus for electrochemical mechanical polishing of a conductive surface of a wafer using a solution, the apparatus comprising:
   a wafer holder configured to hold the wafer;
   a polishing belt pad configured to be disposed proximate to the wafer, the polishing belt pad comprising an embedded contact proximate to a lateral side of the polishing belt pad and configured to electrically connect to the conductive surface of the wafer, wherein the polishing belt pad and the wafer holder are positioned relative to one another such that the embedded contact is configured to contact only an edge surface region of the wafer, wherein the polishing pad belt includes a plurality of openings, wherein the openings in a side of the polishing belt pad opposite to the embedded contact are larger than the openings in the central surface region of the polishing belt pad;
   an electrode proximate to the polishing belt pad and configured to be in contact with the solution; and
   means for providing relative motion between the wafer and the belt pad, wherein an electrical potential difference applied between the electrode and the embedded contact removes conductive material from the conductive surface of the wafer.

16. The apparatus of claim 15, wherein the polishing belt pad includes another embedded contact proximate to another lateral side of the polishing belt pad and configured to electrically connect to the conductive surface of the wafer.

17. The apparatus of claim 16, wherein the another embedded contact is substantially parallel to the embedded contact.

18. The apparatus of claim 16, wherein the openings in a side of the polishing belt pad opposite to the another embedded contact are larger than the openings in the central surface region of the polishing belt pad.

19. The apparatus of claim 15, wherein the means for providing relative motion is configured to rotate the wafer holder.

20. The apparatus of claim 19, wherein the means for providing relative motion is configured to move the polishing belt pad linearly with respect to an axis of the wafer holder.

21. The apparatus of claim 15, wherein the electrode touches a back surface of the polishing belt pad.

22. The apparatus of claim 21, further comprising a solution contact configured to deliver solution onto the polishing belt pad.

23. The apparatus of claim 15, wherein the means for providing relative motion comprises a plurality of rollers on which the polishing belt pad is movable.

24. The apparatus of claim 15, wherein the means for providing relative motion comprises two spools, wherein ends of the polishing belt pad are wound around each of the two spools.

25. The apparatus of claim 15, wherein the polishing belt pad is configured to move in a bi-directional manner.

26. The apparatus of claim 15, wherein the polishing belt pad has one lateral side along which there are no contacts.

27. The apparatus of claim 15, wherein a width of the polishing belt pad is less than a diameter of the wafer.

28. The apparatus of claim 15, wherein the means for providing relative motion comprises a rotation mechanism coupled to the wafer holder.

29. The apparatus of claim 15, wherein the openings are configured to compensate for differences in polishing rate at the edge surface region of the wafer and a central surface region of the wafer.

30. The apparatus of claim 15, wherein the openings in a side of the polishing belt pad opposite to the embedded contact have a different shape than the openings in the central surface region of the polishing belt pad.

31. The apparatus of claim 15, wherein the embedded contact extends along the length of the polishing belt pad.

32. The apparatus of claim 15, wherein the electrode is below the openings of the polishing belt pad.

33. The apparatus of claim 15, wherein the openings are configured to allow the solution to flow therethrough from the electrode to the wafer.

* * * * *